(12) United States Patent
Min

(10) Patent No.: US 10,283,491 B2
(45) Date of Patent: *May 7, 2019

(54) LIGHT EMITTING DEVICE PACKAGE

(71) Applicant: LG INNOTEK CO., LTD., Seoul (KR)

(72) Inventor: Bong Kul Min, Seoul (KR)

(73) Assignee: LG INNOTEK CO., LTD, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/995,222

(22) Filed: Jun. 1, 2018

(65) Prior Publication Data

US 2018/0286842 A1 Oct. 4, 2018

Related U.S. Application Data

(63) Continuation of application No. 15/492,235, filed on Apr. 20, 2017, now Pat. No. 9,991,241, which is a (Continued)

(30) Foreign Application Priority Data

Jun. 1, 2010 (KR) ........................ 10-2010-0051840

(51) Int. Cl.
*H01L 33/00* (2010.01)
*H01L 25/16* (2006.01)
(Continued)

(52) U.S. Cl.
CPC ........ *H01L 25/167* (2013.01); *H01L 25/0753* (2013.01); *H01L 25/13* (2013.01); *H01L 29/866* (2013.01); *H01L 33/38* (2013.01); *H01L 33/60* (2013.01); *H01L 33/62* (2013.01); *H01L 33/647* (2013.01); *F21K 9/00* (2013.01); *H01L 33/507* (2013.01); *H01L 33/56* (2013.01); *H01L 2224/48091* (2013.01); (Continued)

(58) Field of Classification Search
CPC ... H01L 25/0753; H01L 25/13; H01L 29/866; H01L 33/38; H01L 33/60
See application file for complete search history.

(56) References Cited

U.S. PATENT DOCUMENTS 3,820,237 A 6/1974 Effer
3,875,456 A 4/1975 Kano et al.
(Continued)

FOREIGN PATENT DOCUMENTS

CN 101276873 10/2008
CN 201336305 10/2009
(Continued)

OTHER PUBLICATIONS

U.S. Appl. No. 14/231,674, filed Mar. 31, 2013, Min, Bong Kul.
(Continued)

*Primary Examiner* — Samuel A Gebremariam
(74) *Attorney, Agent, or Firm* — KED & Associates LLP

(57) ABSTRACT

A light emitting device package is provided. The light emitting device package may include a main body having a cavity including side surfaces and a bottom, and a first reflective cup and a second reflective cup provided in the bottom of the cavity of the main body and separated from each other. A first light emitting device may be provided in the first reflective cup, and a second light emitting device may be provided in the second reflective cup.

20 Claims, 15 Drawing Sheets

Related U.S. Application Data continuation of application No. 15/213,548, filed on Jul. 19, 2016, now Pat. No. 9,659,916, which is a continuation of application No. 14/865,145, filed on Sep. 25, 2015, now Pat. No. 9,418,973, which is a continuation of application No. 14/227,104, filed on Mar. 27, 2014, now Pat. No. 9,165,912, which is a continuation of application No. 13/604,706, filed on Sep. 6, 2012, now Pat. No. 8,791,486, which is a continuation of application No. 13/113,327, filed on May 23, 2011, now Pat. No. 8,269,246.

(51) Int. Cl.
   *H01L 25/075* (2006.01)
   *H01L 33/60* (2010.01)
   *H01L 25/13* (2006.01)
   *H01L 33/62* (2010.01)
   *H01L 33/64* (2010.01)
   *H01L 29/866* (2006.01)
   *H01L 33/38* (2010.01)
   *F21K 9/00* (2016.01)
   *H01L 33/50* (2010.01)
   *H01L 33/56* (2010.01)

(52) U.S. Cl.
   CPC .............. *H01L 2224/48137* (2013.01); *H01L 2224/48247* (2013.01); *H01L 2224/48465* (2013.01); *H01L 2924/00* (2013.01); *H01L 2924/00014* (2013.01)

(56) References Cited

U.S. PATENT DOCUMENTS

| | | | |
|---|---|---|---|
| 3,914,786 A | 10/1975 | Grossi | |
| 4,255,688 A | 3/1981 | Nagasawa | |
| 5,107,326 A | 4/1992 | Hargasser | |
| 5,298,768 A | 3/1994 | Okazaki et al. | |
| 6,297,598 B1 | 10/2001 | Wang et al. | |
| 6,459,130 B1 | 10/2002 | Arndt et al. | |
| 6,531,328 B1 | 3/2003 | Chen | |
| 7,345,318 B2 | 3/2008 | Okuwaki et al. | |
| 7,411,225 B2 | 8/2008 | Kim et al. | |
| 7,825,426 B2 | 11/2010 | Kobayakawa | |
| 8,269,246 B2 | 9/2012 | Min | |
| 8,684,580 B2 | 4/2014 | Min | |
| 8,791,486 B2 | 7/2014 | Min | |
| 9,165,912 B2 | 10/2015 | Min | |
| 2002/0163001 A1 | 11/2002 | Shaddock | |
| 2005/0248259 A1 | 11/2005 | Chang | |
| 2006/0012992 A1 | 1/2006 | Lee | |
| 2006/0083281 A1 | 4/2006 | Inoguchi | |
| 2006/0208271 A1 | 9/2006 | Kim et al. | |
| 2008/0012033 A1 | 1/2008 | Arndt | |
| 2008/0237621 A1 | 10/2008 | Takemoto | |
| 2009/0108282 A1 | 4/2009 | Matsuda et al. | |
| 2009/0309115 A1 | 12/2009 | Hoshino et al. | |
| 2010/0078661 A1 | 4/2010 | Shi et al. | |

FOREIGN PATENT DOCUMENTS

| | | |
|---|---|---|
| CN | 101604687 | 12/2009 |
| CN | 201475686 | 5/2010 |
| DE | 31 29 996 | 2/1983 |
| DE | 31 48 843 | 6/1983 |
| DE | 42 32 637 | 3/1994 |
| DE | 42 32 644 | 3/1994 |
| EP | 0 400 176 | 12/1990 |
| EP | 0 521 312 | 1/1993 |
| EP | 1 467 414 | 10/2004 |
| JP | S 59-128751 | 8/1984 |
| JP | 60-261181 | 12/1985 |
| JP | H2-8070 | 1/1990 |
| JP | 06-077604 | 3/1994 |
| JP | 06-085328 | 3/1994 |
| JP | H 06-077540 | 3/1994 |
| JP | 06-104356 | 4/1994 |
| JP | 06-196759 | 7/1995 |
| JP | 7-202271 | 8/1995 |
| JP | 07-235696 | 9/1995 |
| JP | H 10-098215 | 4/1998 |
| JP | 2001-185763 | 7/2001 |
| JP | 3227295 | 8/2001 |
| JP | 2002-314138 | 10/2002 |
| JP | 2003-008075 | 1/2003 |
| JP | 2005-203748 | 7/2005 |
| JP | 2005-317592 | 11/2005 |
| JP | 2005-353914 | 12/2005 |
| JP | 2006-093435 | 4/2006 |
| JP | 2006-093697 | 4/2006 |
| JP | 2006-165097 | 6/2006 |
| JP | 2007-027535 | 2/2007 |
| JP | 2007-027765 | 2/2007 |
| JP | 2007-95722 | 4/2007 |
| JP | 2008-098218 | 4/2008 |
| JP | 2008-112966 | 5/2008 |
| JP | 2008-135390 | 6/2008 |
| JP | 2008-172152 | 7/2008 |
| JP | 2008-251604 | 10/2008 |
| JP | 2009-068007 | 4/2009 |
| JP | 2009-081195 | 4/2009 |
| JP | 2009-130359 | 6/2009 |
| JP | 2009-278012 | 11/2009 |
| JP | 2010-003788 | 1/2010 |
| JP | 2010-003877 | 1/2010 |
| JP | 2010-010474 | 1/2010 |
| JP | 2010-45105 | 2/2010 |
| KR | 10-2005-0012372 | 2/2005 |
| KR | 10-2006-0091480 | 8/2006 |
| KR | 10-2008-0061561 A | 7/2008 |
| KR | 10-0855356 | 8/2008 |
| KR | 10-2008-0085505 | 9/2008 |
| KR | 10-2008-0094177 A | 10/2008 |
| KR | 10-0870950 | 12/2008 |
| KR | 10-2009-0032866 | 4/2009 |
| KR | 10-2009-0100967 A | 9/2009 |
| KR | 10-2009-0003378 | 12/2009 |
| KR | 10-2009-0132920 A | 12/2009 |
| KR | 10-2010-0030942 | 3/2010 |
| KR | 10-2010-0114368 | 10/2010 |
| TW | 200908385 | 2/2009 |
| TW | M361722 | 7/2009 |
| WO | WO 2008/149921 | 12/2008 |
| WO | WO 2009/139453 | 11/2009 |

OTHER PUBLICATIONS

U.S. Office Action issued in U.S. Appl. No. 13/113,327 dated Nov. 1, 2011.
U.S. Office Action issued in U.S. Appl. No. 13/113,327 dated Apr. 10, 2012.
U.S. Office Action issued in U.S. Appl. No. 13/604,706 dated May 23, 2013.
U.S. Office Action issued in U.S. Appl. No. 13/604,706 dated Aug. 23, 2013.
European Search Report dated Sep. 4, 2014, issued in Application No. 11168236.5.
U.S. Office Action issued in U.S. Appl. No. 14/227,104 dated Sep. 12, 2014.
Japanese Office Action dated Mar. 13, 2015.
Final U.S. Office Action issued in U.S. Appl. No. 14/227,104 dated Apr. 3, 2015.
U.S. Notice of Allowance issued in U.S. Appl. No. 14/227,107 dated Jun. 26, 2015.
Taiwan Office Action dated Oct. 1, 2015.
Japanese Office Action dated Nov. 2, 2015.
European Examination Report dated Jan. 18, 2016.
European Search Report dated Mar. 23, 2016.
U.S. Office Action issued in U.S. Appl. No. 15/213,548 dated Oct. 7, 2016.

(56) References Cited

OTHER PUBLICATIONS

Japanese Office Action dated Dec. 27, 2016.
U.S. Notice of Allowance issued in U.S. Appl. No. 15/213,548 dated Jan. 20, 2017.
Japanese Office Action dated May 18, 2017.
Chinese Office Action dated Jul. 3, 2017 (English translation).
Chinese Office Action dated Aug. 2, 2017 issued in Application No. 201510784661.2.
Japanese Office Action dated Sep. 11, 2017 issued in Application No. 2016-209128.
European Patent Office Communication dated Oct. 20, 2017 issued in Application No. 11168236.5.

LIGHT EMITTING DEVICE PACKAGE

CROSS-REFERENCE TO RELATED APPLICATIONS

This application is a continuation of U.S. patent application Ser. No. 15/492,235, filed on Apr. 20, 2017, which is a continuation of U.S. patent application Ser. No. 15/213,548, filed on Jul. 19, 2016 (U.S. Pat. No. 9,659,916 issued May 23, 2017), which is a continuation of U.S. patent application Ser. No. 14/865,145 filed on Sep. 25, 2015 (U.S. Pat. No. 9,418,973 issued on Aug. 16, 2016), which is a continuation of U.S. patent application Ser. No. 14/227,104 filed on Mar. 27, 2014 (U.S. Pat. No. 9,165,912 issued Oct. 20, 2015), which is a continuation of U.S. patent application Ser. No. 13/604,706 filed on Sep. 6, 2012 (U.S. Pat. No. 8,791,486 issued Jul. 29, 2014), which is a continuation of U.S. patent application Ser. No. 13/113,327 filed on May 23, 2011 (U.S. Pat. No. 8,269,246 issued on Sep. 18, 2012), which claims the benefit of Korean Patent Application No. 10-2010-0051840, filed in Korea on Jun. 1, 2010, which are hereby incorporated in their entirety by reference as if fully set forth herein.

BACKGROUND OF THE DISCLOSURE

Field of the Disclosure

This relates to a light emitting device package.

Discussion of the Related Art

A light emitting device, for example, a light emitting diode, may include a semiconductor device which converts electrical energy into light. Such a light emitting diode may generate light using such a semiconductor device, thus consuming relatively little power compared to, for example, an incandescent lamp or a fluorescent lamp. The light emitting diode may generate light using a potential gap of the semiconductor device, thus providing relatively long lifespan and fast response time, and being environmentally friendly.

BRIEF DESCRIPTION OF THE DRAWINGS

The embodiments will be described in detail with reference to the following drawings in which like reference numerals refer to like elements wherein.

DETAILED DESCRIPTION

Figure 1:
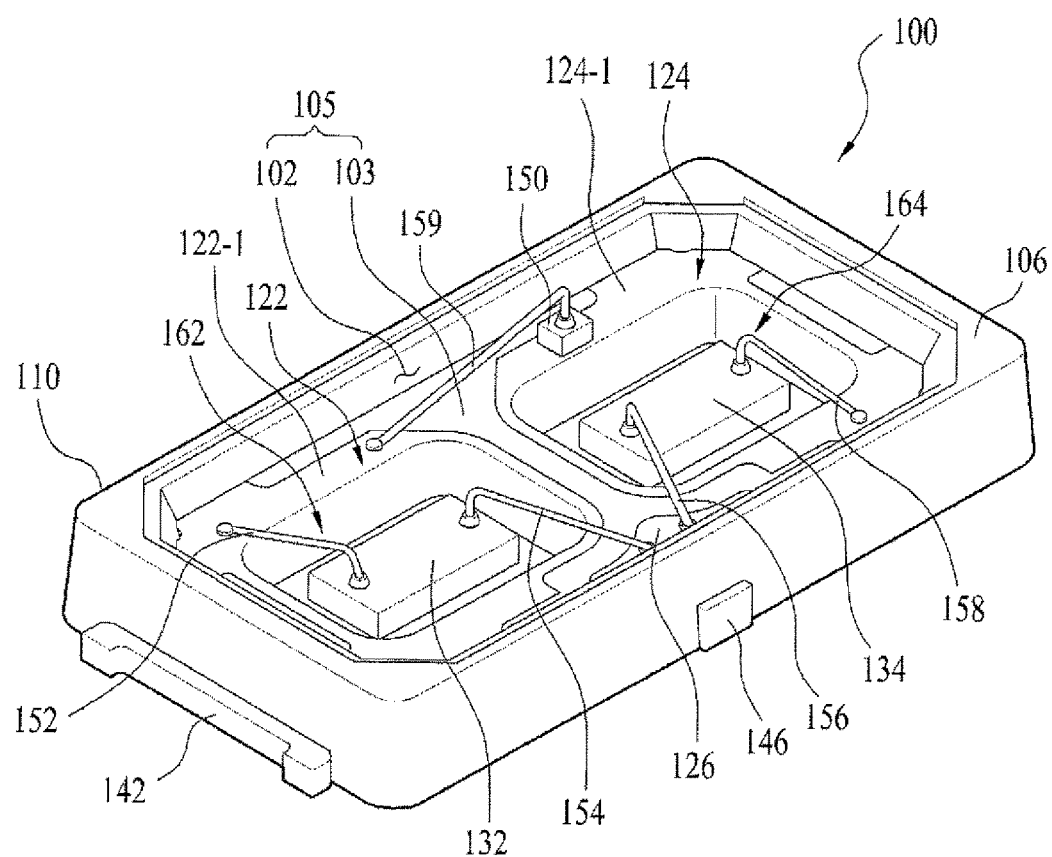
FIG. 1 is a perspective view of a light emitting device package in accordance with an embodiment as broadly described herein.

In the following detailed description, reference is made to the accompanying drawings which form a part hereof, and which show by way of illustration specific embodiments as broadly described herein. In the drawings, the thicknesses or sizes of respective layers may be exaggerated, omitted, or schematically illustrated for convenience and clarity of description. Further, the sizes of respective elements do not necessarily denote the actual sizes thereof. Moreover, the same or similar elements are denoted by the same reference numerals whenever possible even though they may be depicted in different drawings.

As shown in FIG. 1, a light emitting device package 100 in accordance with an embodiment as broadly described herein may include a main body 110, a first reflective cup 122, a second reflective cup 124, a connection pad 126, light emitting devices 132 and 134, a zener diode 150, and wires 152, 154, 156, 158 and 159.

The main body 110 may be made of a material such as, for example, one of a resin, such as polyphthalamide (PPA), silicon (Si), a metal, photo-sensitive glass (PSG), sapphire (Al2O3), and a printed circuit board (PCB). In certain embodiments, the main body 110 is made of a resin, such as polyphthalamide (PPA). The main body 110 may be made of a conductor. If the main body 110 is made of a conductive material, an insulating film may be formed on the surface of the main body 110 so as to prevent an electrical short of the main body 110 with the first reflective cup 122, the second reflective cup 124 and the connection pad 126.

An upper surface 106 of the main body 110, as seen from the top, may have various shapes, such as, for example, a triangle, a rectangle, a polygon, a circle, or other shape as appropriate, according to purposes and designs of a particular light emitting device package. For example, the light emitting device package 100, as shown in FIG. 1, may be used in an edge-type backlight unit (BLU). If, for example, the light emitting device package 100 is applied to a portable flashlight or a home lighting apparatus, the main body 110 may be modified so as to have a size and a shape that may be easily installed within the portable flashlight or the home lighting apparatus.

The main body 110 may include a cavity 105 (hereinafter, referred to as a "main body cavity"). The upper portion of the cavity 105 may be open, and may include side surfaces 102 and a bottom 103. The main body cavity 105 may have a cup shape or a concave container shape, and the side surfaces 102 of the main body cavity 105 may be perpendicular or tilted with respect to the bottom 103. Other arrangements may also be appropriate.

The shape of the main body cavity 105, as seen from the top, may be a circle, an oval, a polygon (for example, a rectangle), or other shape as appropriate. In certain embodiments, the corners of the main body cavity 105 may be curved. In the embodiment shown in FIG. 1, the shape of the main body cavity 105, as seen from the top, is essentially an octagon, and the side surfaces 102 of the main body cavity 105 include eight planes. Four of the eight planes may be referred to as first planes that form the side surfaces 102 of the main body cavity 105 facing the respective corners of the main body 110, and the remaining four planes may be referred to as second planes that form elongated side surfaces 102 of the main body cavity 105 extending between the first planes. An area of the first planes is less than an area of the second planes. The shape of the opposite planes among the first planes and the second planes can be the same. The area of the opposite planes among the first planes and the second planes can be equal. In another embodiment, the side surfaces 102 of the main body cavity 105 can include less than eight planes, and some of the planes can be a curved surface, which can be opposite each other.

The first reflective cup 122 and the second reflective cup 124 may be positioned within the main body 110 under the bottom 103 of the main body cavity 105 such that the first and second reflective cups 122 and 124 are separated from each other by a portion of the bottom 103 of the main body cavity 105. The first reflective cup 122 may be depressed from the bottom 103 of the main body cavity 105 with the upper portion of the first reflective cup 122 being open.

For example, a first cavity 162 may be formed in the bottom 103 of the main body cavity 105, with an upper portion of the first cavity 162 being open. The first cavity 162 may include side surfaces and a bottom, and the first reflective cup 122 may be positioned within the first cavity 162.

The second reflective cup 124 may be separated from the first cavity 162 and also depressed from the bottom 103 of the main body cavity 105, with an upper portion of the second reflective cup 124 being open. For example, a second cavity 164 may be formed in the bottom 103 of the main body cavity 105, with the upper portion of the second cavity 164 being open. The second cavity 164 may include side surfaces and a bottom, and the second reflective cup 124 may be positioned within the second cavity 164. The second cavity 164 may be separated from the first cavity 162 by a portion of the bottom 103 of the main body cavity 105 located between the first reflective cup 122 and the second reflective cup 124, which separates and isolates the first reflective cup 122 and the second reflective cup 124 from each other.

The first cavity 162 and the second cavity 164, as seen from the top, may have a cup shape or a concave container shape, and the side surfaces thereof may be perpendicular or tilted with respect to the bottoms thereof. Other arrangements may also be appropriate.

At least a portion of each of the first reflective cup 122 and the second reflective cup 124 may pass through the main body 110 and be exposed to the outside of the main body 110. Since at least a portion of each of the first reflective cup 122 and the second reflective cup 124 is exposed to the outside of the main body 110, efficiency with which heat generated by the first light emitting device 132 and the second emitting chip 134 is emitted to the outside of the main body 110 may be improved.

For example, one end 142 of the first reflective cup 122 may pass through a first side surface of the main body 110 and be exposed to the outside. Similarly, one end 144 of the second reflective cup 124 may pass through a second side surface of the main body 110 and be exposed to the outside. The first side surface and the second side surface of the main body 110 may be opposite each other, or otherwise positioned as appropriate.

The first reflective cup 122 and the second reflective cup 124 may be made of a metal material, such as, for example, silver, gold, copper, or other material, or may be made of a metal plated therewith. The first reflective cup 122 and the second reflective cup 124 may be made of the same material as the main body 110, and be integrated with the main body 110. Alternatively, the first reflective cup 122 and the second reflective cup 124 may be made of a different material from the main body 110, and be formed separately from the main body 110. In certain embodiments, the first reflective cup 122 and the second reflective cup 124 may be symmetrical with regard to the connection pad 126 in terms of shape and size. The connection pad 126 may be formed within the main body 110 under the bottom 103 of the main body cavity 105 such that the connection pad 126 is separated from the first reflective cup 122 and the second reflective cup 124. The connection pad 126 may be made of a conductive material.

As shown in FIG. 1, the connection pad 126 may be positioned between the first reflective cup 122 and the second reflective cup 124. For example, the connection pad 126 may be positioned at the inside of the bottom 103 of the main body cavity 105 adjacent to a third side surface of the main body cavity 105 between the first reflective cup 122 and the second reflective cup 124. Other arrangements may also be appropriate.

At least a portion of the connection pad 126 may pass through the main body 110 and be exposed to the outside of the main body 110. For example, one end 146 of the connection pad 126 may pass through the third side surface of the main body cavity 105 and be exposed to the outside. In this exemplary arrangement, the third side surface of the main body 110 may be perpendicular with respect to the first and second side surfaces of the main body 110 through which the ends 142 and 144 of the first and second reflective cups 122 and 124 pass.

The zener diode 150 may be provided on one of the first reflective cup 122 or the second reflective cup 124 so as to improve breakdown voltage of the light emitting device package 100. As shown in FIG. 1, the zener diode 150 may be mounted on an upper surface 124-1 of the second reflective cup 124. Other arrangements may also be appropriate.

Figure 2:
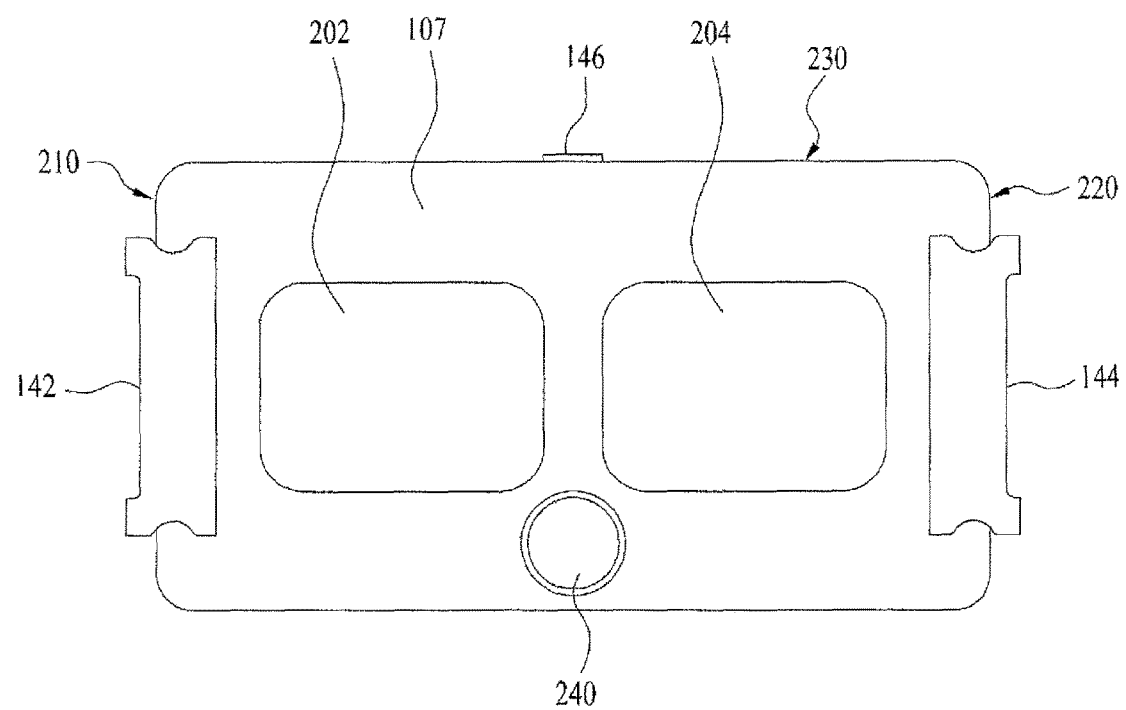
FIG. 2 is a bottom view of the light emitting device package shown in FIG. 1.
Figure 3:
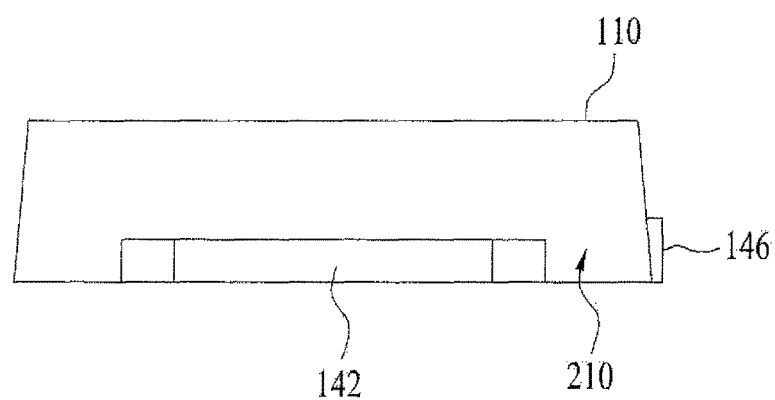
FIG. 3 is a first side view of the light emitting device package shown in FIG. 1.
Figure 4:
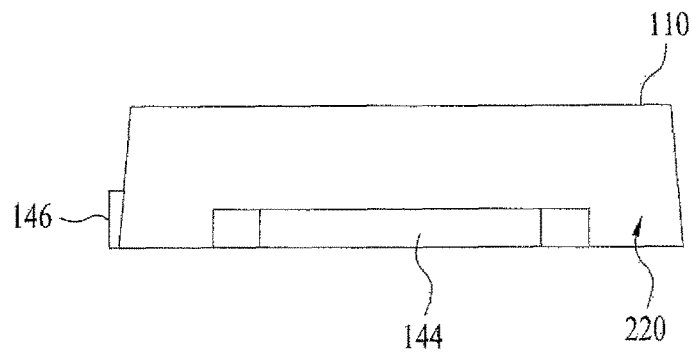
FIG. 4 is a second side view of the light emitting device package shown in FIG. 1.
Figure 5:
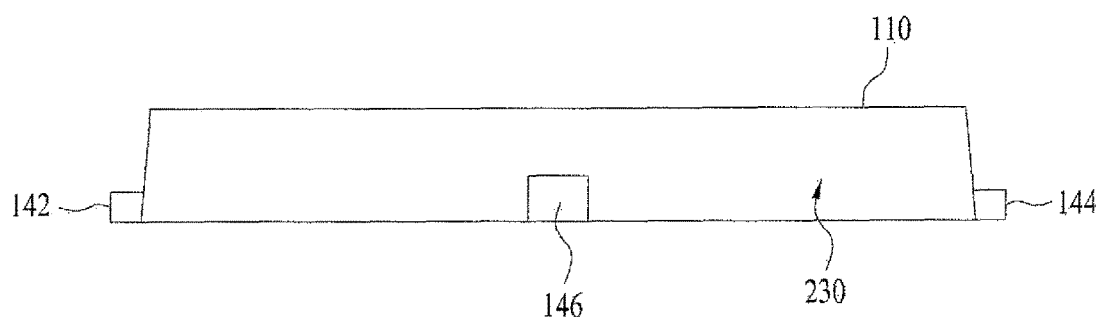
FIG. 5 is a third side view of the light emitting device package shown in FIG. 1.
Figure 6:
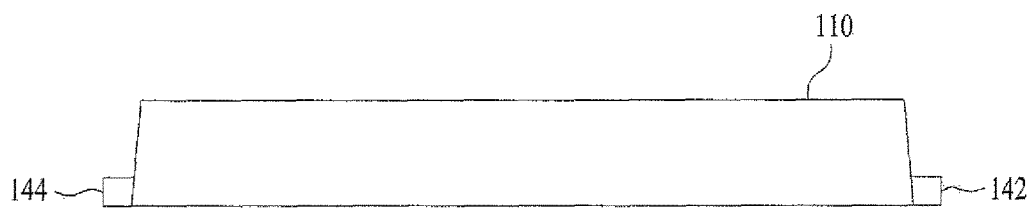
FIG. 6 is a fourth side view of the light emitting device package shown in FIG. 1.

FIG. 2 is a bottom view of the light emitting device package shown in FIG. 1, and FIGS. 3-6 are various side views of the light emitting device package shown in FIG. 1. With reference to FIGS. 2 to 6, a lower surface 202 of the first reflective cup 122 is exposed at a lower surface 107 of the main body 110, through an opening formed therein, and the end 142 of the first reflective cup 122 protrudes from a first side surface 210 of the main body 110 and is exposed to the outside of the main body 110. A lower surface 204 of the second reflective cup 124 is also exposed at the lower surface 107 of the main body 110, through another opening formed therein, and the end 144 of the second reflective cup 124 protrudes from a second side surface 220 of the main body 110 and is exposed to the outside of the main body 110. The end 146 of the connection part 126 protrudes from a third side surface 230 of the main body 110 and is exposed to the outside of the main body 110. The exposed ends 142 and 144 and the lower surfaces 202 and 204 of the first and second reflective cups 122 and 124 may allow heat generated by the first light emitting device 132 and the second emitting chip 134 to be transferred to the outside of the main body 110 and dissipated and the light emitting device package to be cooled more efficiently.

The exposed ends 142 and 144 of the first and second reflective cups 122 and 124 and the exposed end 146 of the connection part 126 may have various shapes, such as, for example, a rectangle, a square, a U shape, or other shape as appropriate. A thickness of each of the first reflective cup 122, second reflective cup 124 and the connection pad 126 may be, for example, approximately 200 um~300 um, and a thickness of the exposed ends 142, 144, 146 may be 0.2 mm~0.3 mm.

The first light emitting device 132 may be provided within the first cavity 162 of the first reflective cup 122 and the second light emitting device 134 may be provided within the second cavity 164 of the second reflective cup 124. That is, the first light emitting device 132 may be positioned on the bottom of the first cavity 162 of the first reflective cup 122 and the second light emitting device 134 may be positioned on the bottom of the second cavity 164 of the second reflective cup 124. The first light emitting device 132 may be separated from the side surfaces of the first cavity 162 and the second light emitting device 134 may be separated from the side surfaces of the second cavity 164. A length of the first light emitting device 132 and a length of the second light emitting device 134 may be, for example, approximately 400 um~1200 um respectively. A width of the first light emitting device 132 and a width of the second light emitting device 134 may be, for example, approximately 400 um~1200 um respectively. A thickness of the first light emitting device 132 and a thickness of the second light emitting device 134 may be, for example, approximately 100 um~200 um respectively. For example, a chip size of the first light emitting device 132 and a chip size of the second light emitting device may be 800 um×400 um. A thickness of the first light emitting device 132 and a thickness of the second light emitting device may be 100 um×150 um.

The wires 152, 154, 156 and 158 may connect the first light emitting device 132 and the second light emitting device 134 via the connection pad 126. In the embodiment shown in FIG. 1, The first wire 152 connects the first light emitting device 132 and the first reflective cup 122, the second wire 154 connects the first light emitting device 132 and the connection pad 126, the third wire 156 connects the connection pad 126 and the second light emitting device 134, and the fourth wire 158 connects the second light emitting device 134 and the second reflective cup 124. The second wire 154 may be bonded between the connection pad 126 and the first light emitting device 132 and the third wire 156 may be bonded between the connection pad 126 and the second light emitting device 134, thereby electrically connecting the first light emitting device 132 and the second light emitting device 134.

As shown in FIG. 1, the zener diode 150 may be mounted on the upper surface 124-1 of the second reflective cup 124 and may be electrically connected to the first reflective cup 122 by the fifth wire 159. For example, one end of the fifth wire 159 may be bonded to the zener diode 150 and the other end of the fifth wire 159 may be bonded to an upper surface 122-1 of the first reflective cup 122. In alternative embodiments, the zener diode 150 may be mounted on the upper surface 122-1 of the first reflective cup 124, and one end of the fifth wire 159 may be bonded to the zener diode 150 and the other end of the fifth wire 159 may be bonded to the upper surface 124-1 of the second reflective cup 124.

The connection pad 126 may be separated from the first reflective cup 122 and the second reflective cup 124, thus being independent of the first light emitting device 132 and the second light emitting device 134. This may allow the connection pad 126 to stably electrically connect the first light emitting device 132 and the second light emitting device 134 in series, thereby improving electrical reliability.

As the first light emitting device 132 and the second light emitting device 134 emit light, they may also generate heat in the course of operation. The first reflective cup 122 may prevent heat generated by the first light emitting device 132 from being radiated or transferred to the main body 110, and the second reflective cup 124 may prevent heat generated by the second light emitting device 134 from being radiated or transferred to the main body 110. That is, the first reflective cup 122 and the second reflective cup 124 may thermally separate the first light emitting device 132 and the second light emitting device 134. Further, the first reflective cup 122 and the second reflective cup 124 may prevent light emitted from the first light emitting device 132, and light emitted from the second light emitting device 134, from interfering with each other. Moreover, since the first reflective cup 122 and the second reflective cup 124 are positioned at an inner bottom portion of the main body 110, thermal separation between the first reflective cup 122 and the second reflective cup 124 may be improved and prevention of light interference between the first light emitting device 132 and the second light emitting device 134 may be improved.

Consequently, in this embodiment, the first light emitting device 132 is positioned within the first cavity 162 of the first reflective cup 122 and the second light emitting device 134 is positioned within the second cavity 164 of the second reflective cup 124, thereby being thermally and optically separated from each other.

A resin injection hole 240 through which a resin may be injected into the main body 110 may be formed on the lower surface 107 of the main body 110. The resin injection hole 240 may be located at a position between the first reflective cup 122 and the second reflective cup 124.

Figure 7:
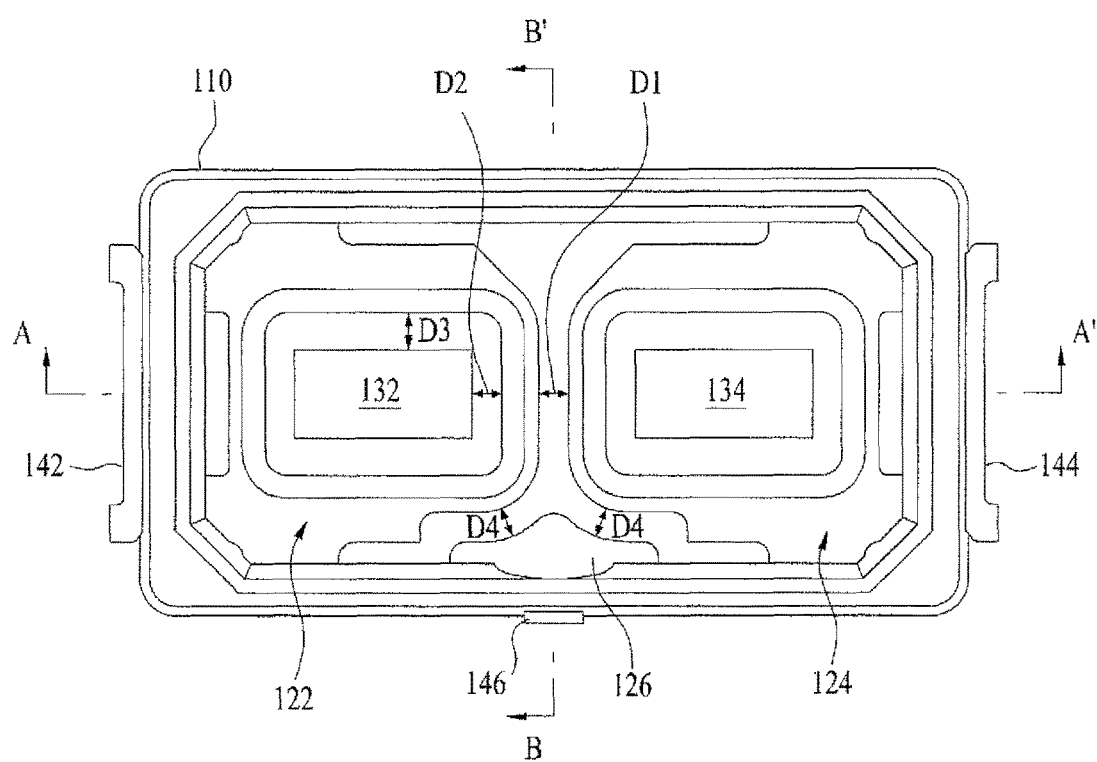
FIG. 7 is a plan view of the light emitting device package shown in FIG. 1.

FIG. 7 is a plan view of the light emitting device package shown in FIG. 1. In FIG. 7, simply for clarity convenience of description, the wires 152, 154, 156, 158 and 159 of FIG. 1 are omitted. As shown in FIG. 7, the first reflective cup 122 and the second reflective cup 124 may be separated by a designated distance D1, and the bottom of the main body 110, which may be made of polyphthalamide (PPA), may have a portion thereof located therebetween.

In order to separate the heat sources (heat generated by operation of the first and second chips 132 and 134) and to effectively prevent light interference between the light emitting devices 132 and 134, the separation distance D1 between the first reflective cup 122 and the second reflective cup 124 may be, for example, 100 μm or more. Other separation distances may also be appropriate, based on relative sizes of the related components.

Further, in order to effectively prevent light interference between the light emitting devices 132 and 134 and to increase reflection efficiency, the first light emitting device 132 may be positioned on the bottom of the first reflective cup 124 and separated from the side surfaces of the first reflective cup 122 by designated distances, and the second light emitting device 134 may be positioned on the bottom of the second reflective cup 124 and separated from the side surfaces of the second reflective cup 124 by designated distances. Separation distances from the first light emitting device 132 to opposite side surfaces of the first reflective cup 122 may be equal or unequal. Separation distances from the second light emitting device 134 to opposite side surfaces of the second reflective cup 124 may be equal or unequal.

For example, a pitch between the first light emitting device 132 mounted on the first reflective cup 122 and the second light emitting device 134 mounted on the second reflective cup 124 may be 2 mm~3 mm.

For example, the first light emitting device 132 may be mounted at the center of the bottom of the first reflective cup 122 and the second light emitting device 134 may be mounted at the center of the bottom of the second reflective cup 124.

In more detail, a separation distance D2 from a short side surface of the first reflective cup 122 to the first light emitting device 132 may be, for example, 200 μm, and a separation distance D3 from a long side surface of the first reflective cup 122 to the first light emitting device 132 may be, for example, 500 μm. Other separation distances may also be appropriate, based on chip size relative to reflective cup size.

The connection pad 126 may be separated from both the first reflective cup 122 and the second reflective cup 124 by a designated distance D4, and the bottom of the main body 110, which may be, made of polyphthalamide (PPA), may have a portion thereof located therebetween.

For example, the separation distance D4 between the first reflective cup 122 and the connection pad 126 may be equal to the separation distance D1 between the first reflective cup 122 and the second reflective cup 124. Other separation distances may also be appropriate based on relative sizes of the related components.

Figure 8:
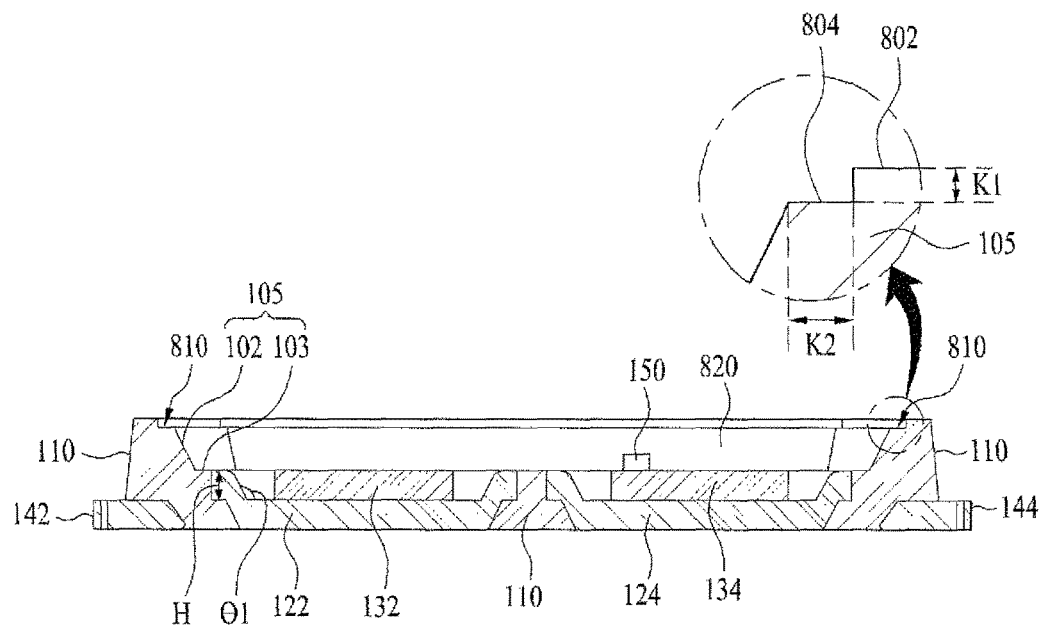
FIG. 8 is a cross-sectional view taken along the line A-A' of the light emitting device package shown in FIG. 7.

FIG. 8 is a cross-sectional view taken along the line A-A' of the light emitting device package shown in FIG. 7. In FIG. 8, simply for clarity, the wires 152, 154, 156, 158 and 159 are omitted.

As shown in FIG. 8, a tilt angle θ1 of the side surfaces of the first reflective cup 122 may be different from a tilt angle of the side surfaces of the main body cavity 105. For example, the tilt angle θ1 of the side surfaces of the first reflective cup 122 with respect to the bottom of the first reflective cup 122 may be 90~160°. Other orientations may also be appropriate. A tilt angle θ2 of the side surfaces 102 of the main body cavity 105 with respect to the bottom 103 of the main body cavity 105 may be, for example, 140~170°.

The upper end of the side surface of the main body cavity 105 may include a bent edge. That is, the side surface of the upper end of the main body cavity 105 may be bent. In more detail, the main body cavity 105 may have an edge part 804 which is located between an upper surface 802 of the main body 110 and the bottom 103. The edge part 804 may have a height difference K1 with the upper surface 802 of the main body 110, and may be parallel with the upper surface 802 of the main body 110. For example, the edge part 804 may be formed at the upper ends of the side surfaces 102 of the main body cavity 105.

The height difference K1 between the upper surface 802 of the main body cavity 105 and the edge part 804 may be, for example. 50~80 μm, and a length K2 of the edge part 804 may be 50~130 μm. Other heights/lengths may also be appropriate, based on the dimensions of the related components. Furthermore, the upper ends of the side surfaces 102 of the main body cavity 105 may have more than two edge parts, each having a height difference so as to form a series of steps. Formation of the edge part 804 having the height difference K1 with the upper surface 802 at the upper ends of the side surfaces 102 of the main body cavity 105 may lengthen a gas infiltration route, thereby preventing external gas from infiltrating the inside of the light emitting device package 100 and thus improving gas tightness of the light emitting device package 100.

In order to prevent light interference between the light emitting devices 132 and 134 and to improve light reflection efficiency, a depth H of the first reflective cup 122 and the second reflective cup 124 may be determined by taking into consideration a height of the light emitting devices 132 and 134.

Figure 13A:
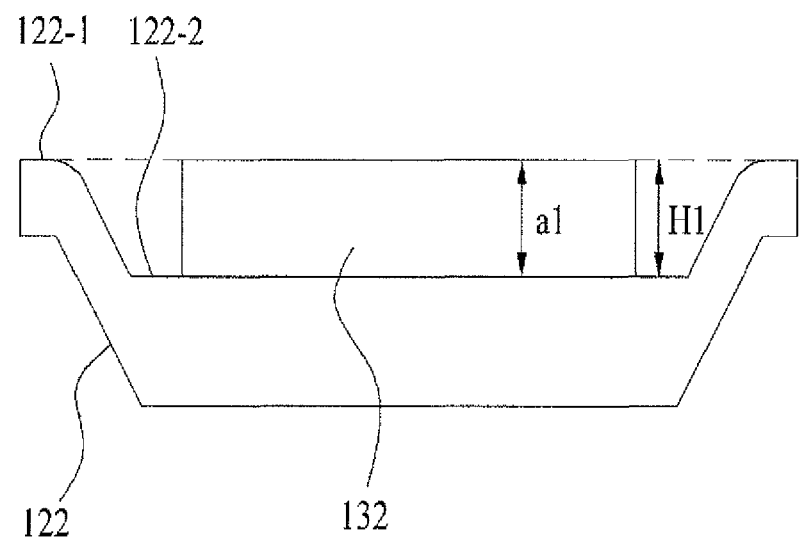
FIG. 13a illustrates a depth of a first reflective cup in accordance with an embodiment as broadly described herein.

For example, as shown in FIG. 13a, the upper surface 122-1 of the first reflective cup 122 may be parallel with the upper surface of the first light emitting device 132 mounted on the bottom 122-2 of the first reflective cup 122. A depth H1 of the first reflective cup 122 may equal to a height a1 of the first light emitting device 132 (H1=a1). The depth H1 may be a distance between the upper surface 122-1 and the bottom 122-2 of the first reflective cup 122. A depth of the second reflective cup 124 relative to the height of the light emitting chip 134 in this embodiment may be determined in a similar manner. In certain embodiments, the depth of the first reflective cup 122 may be equal to the depth of the second reflective cup 124. Other heights of the reflective cups 122 and 124 and corresponding heights of the light emitting devices 132 and 134 and combinations thereof may also be appropriate.

Figure 13B:
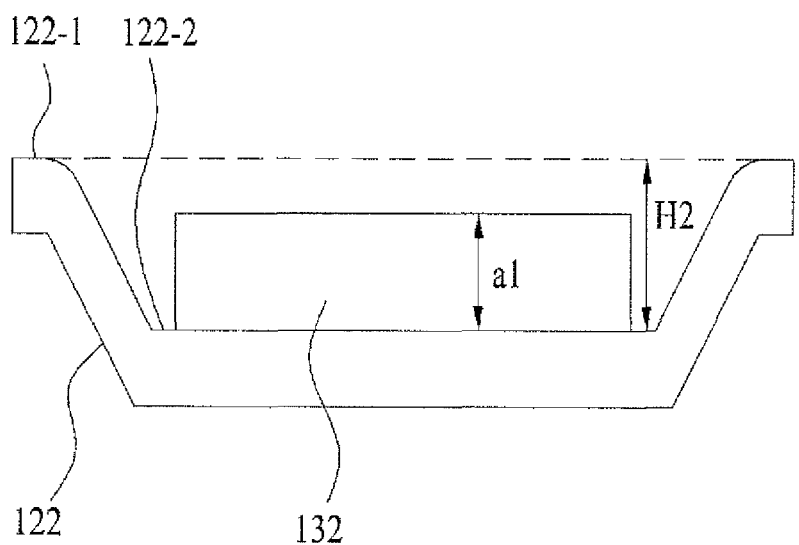
FIG. 13b illustrates a depth of a first reflective cup in accordance with another embodiment as broadly described herein.

In the embodiment shown in FIG. 13b, the upper surface 122-1 of the first reflective cup 122 is higher than the upper surface of the first light emitting device 132 mounted on the bottom 122-2 of the first reflective cup 122. That is, a depth H2 of the first reflective cup 122 is greater than a height a1 of the first light emitting device 132 (H2>a1). In certain embodiments, the depth H2 of the first reflective cup 122 may be greater than the height a1 of the first light emitting device 132 and less than twice the height a1 of the first light emitting device 132(a1<H2<2a1). A depth of the second reflective cup 124 relative to the light emitting chip 134 in this embodiment may be determined in a similar manner.

Figure 13C:
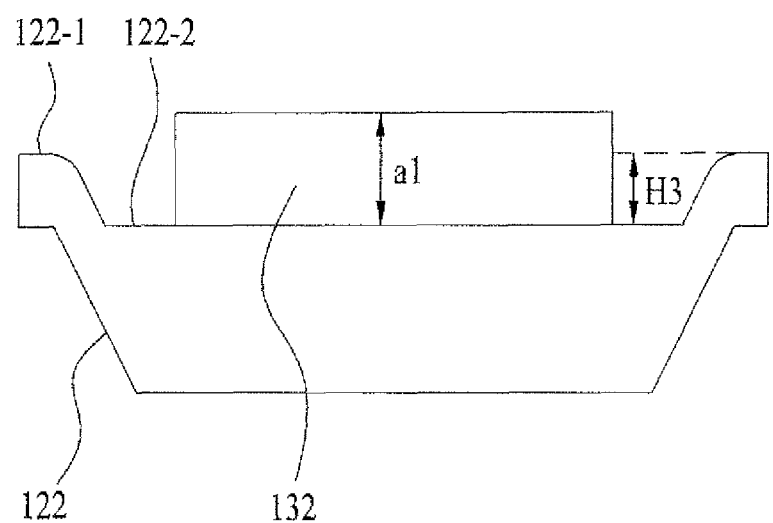
FIG. 13c illustrates a depth of a first reflective cup in accordance with another embodiment as broadly described herein.

In the embodiment shown in FIG. 13c, the upper surface 122-1 of the first reflective cup 122 is lower than the upper surface of the first light emitting device 132 mounted on the bottom 122-2 of the first reflective cup 122. A depth H3 of the first reflective cup 122 is less than a height a1 of the first light emitting device 132 (H3<a1). In certain embodiments, the depth H3 of the first reflective cup 122 may be less than the height a1 of the first light emitting device 132 and greater than half the height a1 of the first light emitting device 132 (a1/2<H3<a1). A height of the second reflective cup 124 relative to the light emitting chip 134 in this embodiment may be determined in a similar manner.

Figure 9:
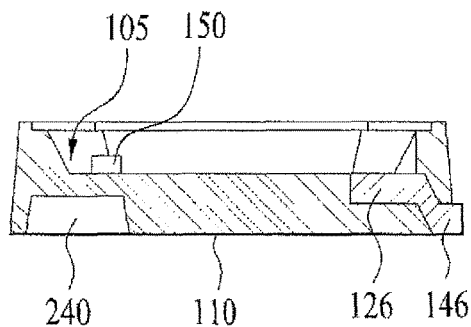
FIG. 9 is a cross-sectional view taken along the line B-B' of the light emitting device package shown in FIG. 7.

FIG. 9 is a cross-sectional view taken along the line B-B' of the light emitting device package shown in FIG. 7. In FIG. 9, the wires 152, 154, 156, 158 and 159 are omitted, simply for clarity. As shown in FIG. 9, the upper surface of the connection pad 126 may be substantially parallel with the upper surfaces of the first reflective cup 122 and the second reflective cup 124, and the end 146 of the connection pad 126 may form a portion of the bottom of the main body 110 as it passes through the third side surface 230 of the main body 110 and is exposed to the outside of the main body 110.

In the light emitting device package 100 in accordance with this embodiment, as shown in FIG. 8, the inside of the main body cavity 105 may be filled with an encapsulation material 820 so as to seal and protect the first light emitting device 132 and the second light emitting device 134.

The encapsulation material 820 may fill the inside of the first reflective cup 122 in which the first light emitting device 132 is mounted and the inside of the second reflective cup 124 in which the second light emitting device 134 is mounted, as well as the inside of the main body cavity 105 so as to also isolate the first light emitting device 132 and the second light emitting device 134 from the outside. The encapsulation material 820 may be, for example, a silicon, a resin, or other such material. Formation of the encapsulation material 820 may be achieved by filling the inside of the main body cavity 105 with a silicon or a resin material and then curing the material as appropriate. The encapsulation material 820 may be other materials filled in the cavity 105 in an appropriate manner.

The encapsulation material 820 may include phosphors to change characteristics of light emitted from the first light emitting device 132 and the second light emitting device 134, and light emitted from the first and second light emitting devices 132 and 134 may be excited by the phosphors to thus implement different colors. For example, if the light emitting devices 132 and 134 are blue light emitting diodes and the encapsulation material 820 includes yellow phosphors, blue light is excited by the yellow phosphors, thereby generating white light. If the light emitting devices 132 and 134 emit ultraviolet (UV) light, the encapsulation material 820 may include red (R), green (G) and blue (B) phosphors so as to generate white light. Further, a lens may also be provided on the encapsulation material 820 so as to adjust a distribution of light emitted by the light emitting device package 100.

Figure 10:
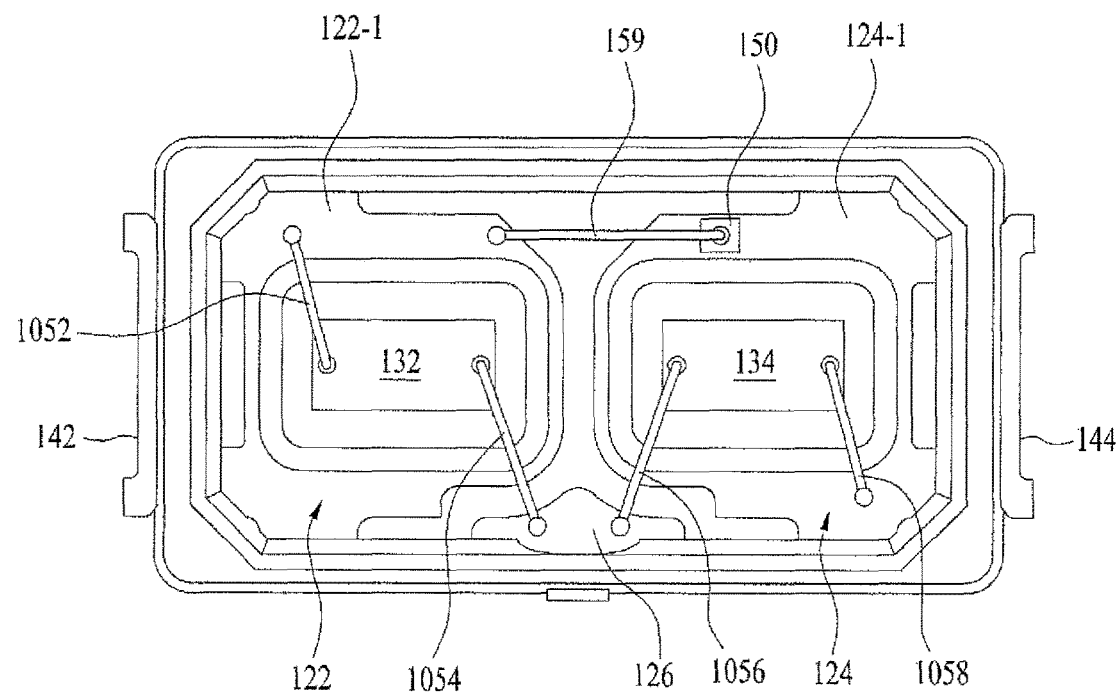
FIG. 10 illustrates a series connection of light emitting devices of a light emitting device package in accordance with an embodiment as broadly described herein.

FIG. 10 illustrates a series connection of light emitting devices of a light emitting device package in accordance with an embodiment as broadly described herein. As shown in FIG. 10, one end of a first wire 1052 may be bonded to the upper surface 122-1 of the first reflective cup 122 and the other end of the first wire 1052 may be bonded to the first light emitting device 132. Further, one end of a second wire 1054 may be bonded to the first light emitting device 132 and the other end of the second wire 1054 may be bonded to the connection pad 126. One end of a third wire 1056 may be bonded to the connection pad 126 and the other end of the third wire 1056 may be bonded to the second light emitting device 134. Further, one end of a fourth wire 1058 may be bonded to the second light emitting device 134 and the other end of the fourth wire 1058 may be bonded to the upper surface 124-1 of the second reflective cup 124.

The light emitting devices 132 and 134 shown in FIG. 10 may be electrically connected in series by the first to fourth wires 1052, 1054, 1056 and 1058. Since the series connection between the light emitting devices 132 and 134 shown in FIG. 10 is achieved via the connection pad 126 independent of the light emitting devices 132 and 134, the first light emitting device 132 and the second light emitting device 134 may be stably electrically connected in series, thereby improving electrical reliability of the light emitting device package.

Figure 11:
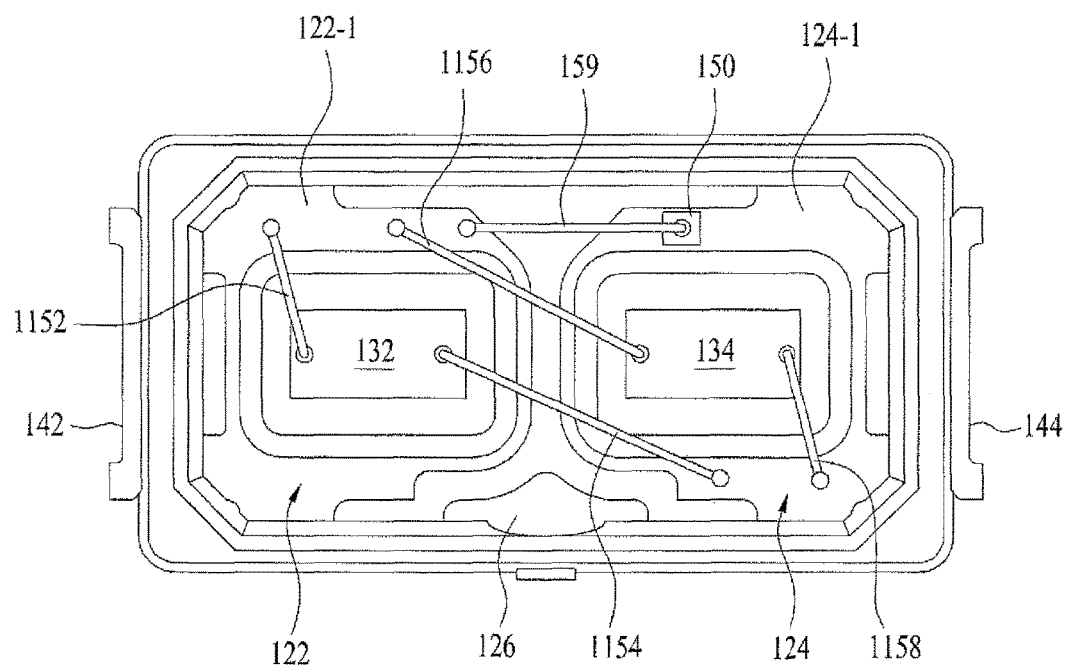
FIG. 11 illustrates a parallel connection of light emitting devices of a light emitting device package in accordance with another embodiment as broadly described herein.

FIG. 11 illustrates a parallel connection of light emitting devices of a light emitting device package in accordance with another embodiment as broadly described herein. As shown in FIG. 11, one end of a first wire 1152 may be bonded to the upper surface 122-1 of the first reflective cup 122 and the other end of the first wire 1152 may be bonded to the first light emitting device 132. One end of a second wire 1154 may be bonded to the first light emitting device 132 and the other end of the second wire 1154 may be bonded to the upper surface 124-1 of the second reflective cup 124. One end of a third wire 1156 may be bonded to the upper surface 122-1 of the first reflective cup 122 and the other end of the third wire 1156 may be bonded to the second light emitting device 134. Finally, one end of a fourth wire 1158 may be bonded to the second light emitting device 134 and the other end of the fourth wire 1158 may be bonded to the upper surface 124-1 of the second reflective cup 124. Therefore, the light emitting devices 132 and 134 shown in FIG. 11 may be electrically connected in parallel by the first to fourth wires 1152, 1154, 1156 and 1158.

Figure 12:
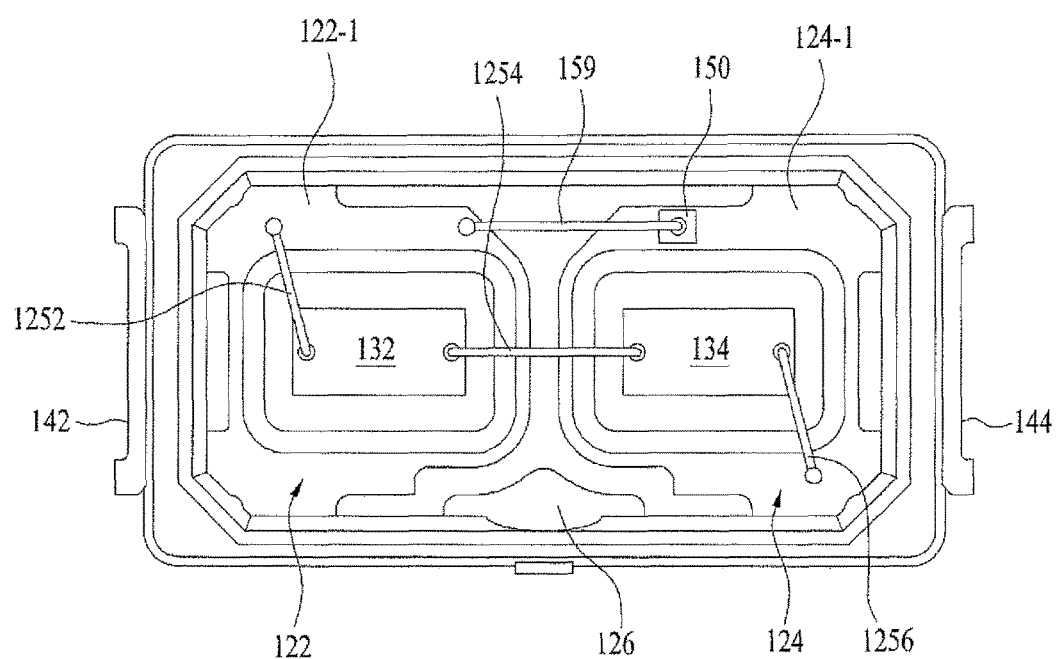
FIG. 12 illustrates a series connection of light emitting devices of a light emitting device package in accordance with another embodiment as broadly described herein.

FIG. 12 illustrates a series connection of light emitting devices of a light emitting device package in accordance with another embodiment as broadly described herein. As shown in FIG. 12, one end of a first wire 1252 may be bonded to the upper surface 122-1 of the first reflective cup 122 and the other end of the first wire 1252 may be bonded to the first light emitting device 132. Further, one end of a second wire 1054 may be bonded to the first light emitting device 132 and the other end of the second wire 1054 may be bonded directly to the second light emitting device 134. One end of a third wire 1156 may be bonded to the second light emitting device 134 and the other end of the third wire 1156 may be bonded to the upper surface 124-1 of the second reflective cup 124.

The light emitting devices 132 and 134 shown in FIG. 12 may be electrically connected in series by the first to third wires 1252, 1254 and 1256. Differing from FIG. 10, the first light emitting device 132 and the second light emitting device 134 are not connected via the connection pad 126 but are directly connected by the second wire 1254.

The above-described wires respectively bonded to the first reflective cup 122, the second reflective cup 124, the first light emitting device 132, the second light emitting device 134 and the zener diode 150 may be located under the upper surface 106 of the main body cavity 105.

The above-described embodiments do not describe one cup-type light emitting device packages, but rather, describe the light emitting device package 100 in which the light emitting devices 132 and 134 are respectively mounted in two separate reflective cups 122 and 124 in the main body 110. Through such a structure, the light emitting devices 132 and 134, which generate heat during operation, may be separated from each other, and heat generated by the light emitting devices 132 and 134 may be blocked by the reflective cups 122 and 124, thereby preventing discoloration of the main body 110 of the light emitting device package 100 due to heat and extending lifespan of the light emitting device package 100. Further, the two separate reflective cups 122 and 124 may prevent light interference between the light emitting devices 132 and 134.

Figure 14:
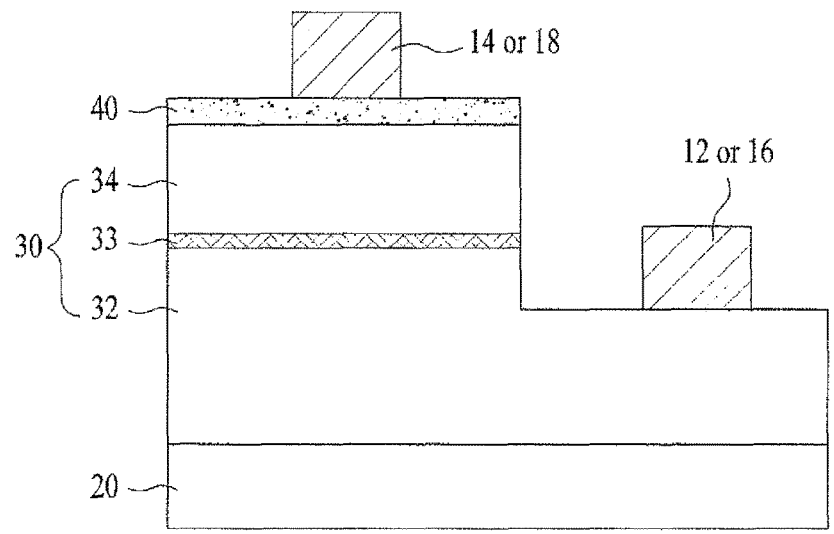
FIG. 14 illustrates a first light emitting device and a second light emitting device in accordance with an embodiment as broadly described herein.

FIG. 14 illustrates a structure of a first light emitting device and a second light emitting device in accordance with an embodiment as broadly described herein. As shown in FIG. 14, the first light emitting device 132 may include a substrate 20, a light emitting structure 30, a conductive layer 40, a first electrode 12, and a second electrode 14. The second light emitting device 134 may include a substrate 20, a light emitting structure 30, a conductive layer 40, a third electrode 16, and a fourth electrode 18. The second light emitting device 134 may include the same components as those of the first light emitting device 132.

The substrate 20 supports the light emitting structure 30 and may be one of a sapphire substrate, a silicon Si substrate, zinc oxide ZnO substrate, or a nitride semiconductor substrate or a template substrate having at least one of GaN, InGaN, AlInGaN, SiC, GaP, InP, Ga$_2$O$_3$, and GaAs stacked thereon.

The light emitting structure 30 may include a first conductive type semiconductor layer 32, an active layer 33, and a second conductive type semiconductor layer 34. For example, the light emitting structure 30 may be a structure in which the first conductive type semiconductor layer 32, the active layer 33, and the second conductive type semiconductor layer 34 are stacked on the substrate 20 in succession.

The first conductive type semiconductor layer 32 may be arranged on the substrate 20 and may include, for example, an n type semiconductor layer selected from a semiconductor material having a composition of In$_x$Al$_y$Ga$_{1-x-y}$N (0≤x≤1, 0≤y≤1, 0≤x+y≤1), for example, GaN, AlN, AlGaN, InGaN, InN, InAlGaN, AlInN, and may be doped with an n type dopant, such as Si, Ge, Sn, Se, Te.

The active layer 33 may be arranged on the first semiconductor layer 32 and may include, for example, a semiconductor material having a composition of In$_x$Al$_y$Ga$_{1-x-y}$N (0≤x≤1, 0≤y≤1, 0≤x+y≤1), and may include at least one of a quantum wire structure, a quantum dot structure, a single quantum well structure, or a multi quantum well structure MQW.

The second conductive type semiconductor layer 34 may be arranged on the active layer 33 and may be, for example, a p type semiconductor layer selected from a semiconductor material having a composition of In$_x$Al$_y$Ga$_{1-x-y}$N (0≤x≤1, 0≤y≤1, 0≤x+y≤1), for an example, GaN, AlN, AlGaN, InGaN, InN, InAlGaN, AlInN, and may be doped with a p type dopant, such as Mg, Zn, Ca, Sr, Ba.

The light emitting structure 30 may be a structure in which the second conductive type semiconductor layer 34, the active layer 33 and a portion of the first conductive type semiconductor layer 32 are mesa etched to expose a region of the first conductive type semiconductor layer 32.

The conductive layer 40 may be arranged on the second conductive type semiconductor layer 34. Since the conductive layer 40 not only reduces total reflection, but also has good light transmissivity, the conductive layer 40 increases extraction efficiency of the light emitted from the active layer 33 to the second conductive type semiconductor layer 34. The conductive layer 40 may be formed of a transparent oxide group material having high transmissivity on a wavelength of a light. For example, the transparent oxide group material may be ITO (Indium Tin Oxide), TO (Tin Oxide), IZO (Indium Zinc Oxide), or ZnO (Zinc Oxide).

The first electrode 12 or the third electrode 16 may be arranged on the exposed region of the first conductive type semiconductor layer 32. The second electrode 14 or the fourth electrode 18 may be arranged on the conductive layer 40. The first electrode 12 and the second electrode 14 may be different types of electrodes. The third electrode 16 and the fourth electrode 14 may be different types of electrodes. The first electrode 12 and the third electrode 18 may be the same type of electrode. The second electrode 14 and the fourth electrode 18 may be the same type of electrode. For example, the first electrode 12 and the third electrode 16 may be n-type electrodes, and the second electrode 14 and the fourth electrode 18 may be p-type electrodes. The first and fourth electrodes 12,14,16,18 may be a single layer or a multi-layer material or an alloy including at least one of Ti, Al, an Al alloy, In, Ta, Pd, Co, Ni, Si, Ge, Ag, an Ag alloy, Au, Hf, Pt, Ru, or Au.

Figure 15:
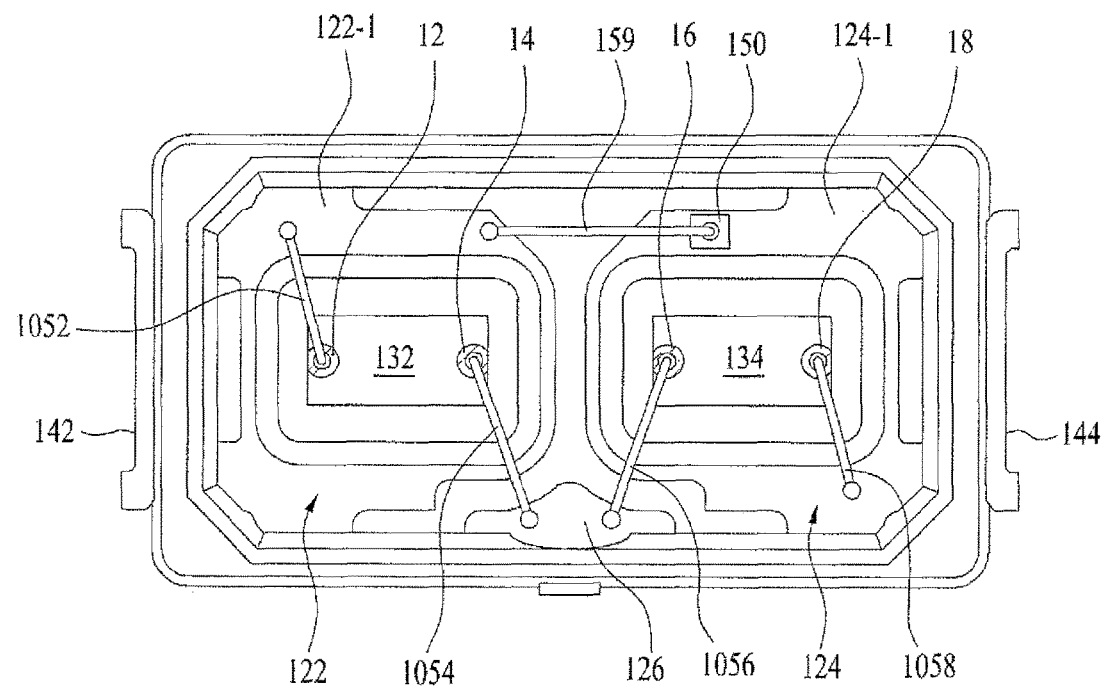
FIG. 15 illustrates a first connection between first, second, third, and fourth electrodes in accordance with an embodiment as broadly described herein.

FIG. 15 illustrates a first connection between first, second, third, and fourth electrodes in accordance with an embodiment as broadly described herein. One of the first electrode 12 or the second electrode 14 may be electrically connected to the first reflective cup 122, and one of the third electrode 16 or the fourth electrode 18 may be electrically connected to the second reflective cup 124. The connection pad 126 electrically connects the other of the first electrode 12 or the second electrode 14 with the other of the third electrode 16 and the fourth electrode 18.

For example, the first electrode 12 of the first light emitting device 132 may be electrically connected to the first reflective cup 122 by the first wire 1052, and the fourth electrode 18 of the second light emitting device 134 may be electrically connected to the second reflective cup 124 by the fourth wire 1058. The connection pad 126 may electrically connect the second electrode 14 of the first light emitting device 132 with the third electrode 16 of the second light emitting device 134 by the second and third wires 1054 and 1056. The second electrode 14 of the first light emitting device may be electrically connected to the connection pad 126 by the second wire 1054, and the third electrode 16 of the second light emitting device 134 may be electrically connected to the connection pad 126 by the third wire 1056.

Figure 16:
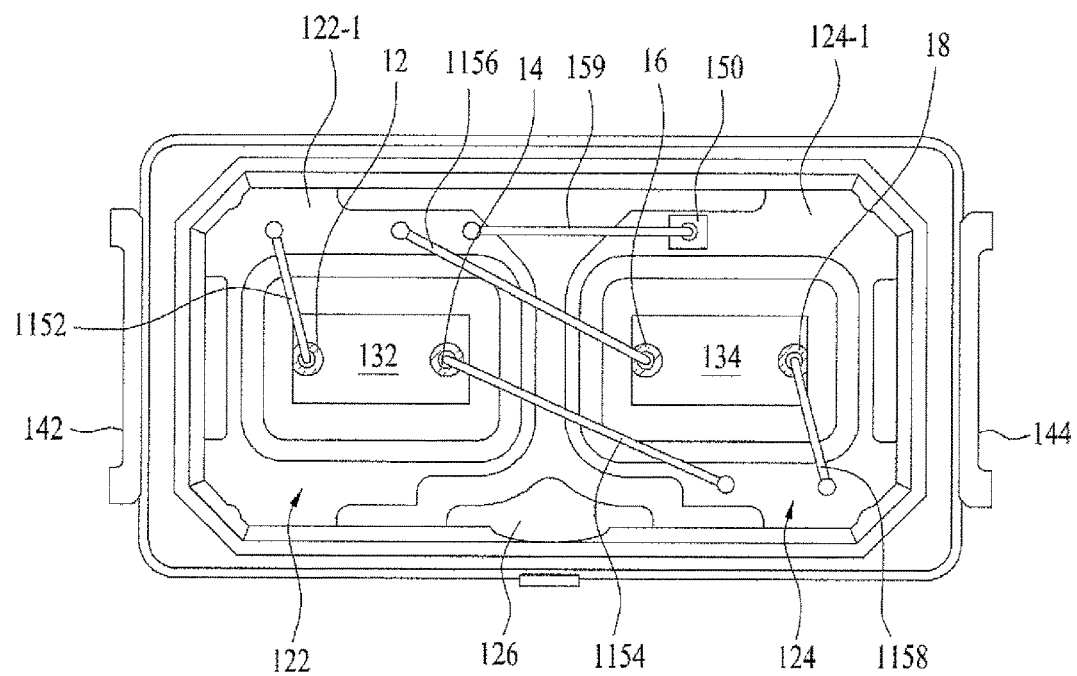
FIG. 16 illustrates a second connection between first, second, third, and fourth electrodes in accordance with an embodiment as broadly described herein.

FIG. 16 illustrates a second connection between first, second, third, and fourth electrodes in accordance with an embodiment as broadly described herein. As shown in FIG. 16, one of the first electrode 12 or the second electrode 14 may be electrically connected to the first reflective cup 122, and one of the third electrode 16 or the fourth electrode 18 may be electrically connected to the second reflective cup 124. The other of the first electrode 12 or the second electrode 14 may be electrically connected to the second reflective cup 124. The other of the third electrode 16 or the fourth electrode 18 may be electrically connected to the first reflective cup 122.

For example, the first electrode 12 of the first light emitting device 132 may be electrically connected to the first reflective cup 122 by the first wire 1152, and the fourth electrode 18 of the second light emitting device 134 may be electrically connected to the second reflective cup 124 by the fourth wire 1158. The second electrode 14 of the first light emitting device may be electrically connected to the second reflective cup 124 by the second wire 1154, and the third electrode 16 of the second electrode 134 may be electrically connected to the first electrode 122 by the third wire 1056.

Figure 17:
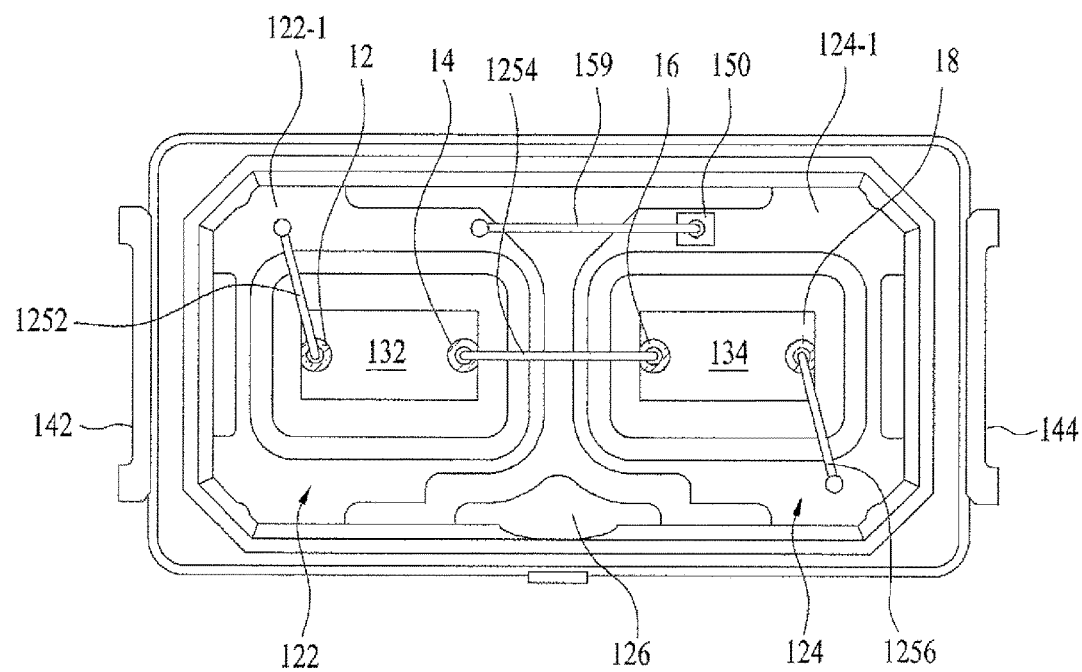
FIG. 17 illustrates a third connection between first, second, third, and fourth electrodes in accordance with an embodiment as broadly described herein.

FIG. 17 illustrates a third connection between first, second, third, and fourth electrodes in accordance with an embodiment as broadly described herein. As shown in FIG. 17, one of the first electrode 12 or the second electrode 14 may be electrically connected to the first reflective cup 122, and one of the third electrode 16 or the fourth electrode 18 may be electrically connected to the second reflective cup 124. The other of the first electrode 12 or the second electrode 14 may be electrically connected to the other of the third electrode 16 or the fourth electrode 18.

For example, the first electrode 12 of the first light emitting device 132 may be electrically connected to the first reflective cup 122 by the first wire 1252, and the fourth electrode 18 of the second light emitting device 134 may be electrically connected to the second reflective cup 124 by the fourth wire 1258. The second electrode 14 of the first light emitting device may be electrically connected to the third electrode 16 of the second light emitting device 134 by the third wire 1254.

Figure 18:
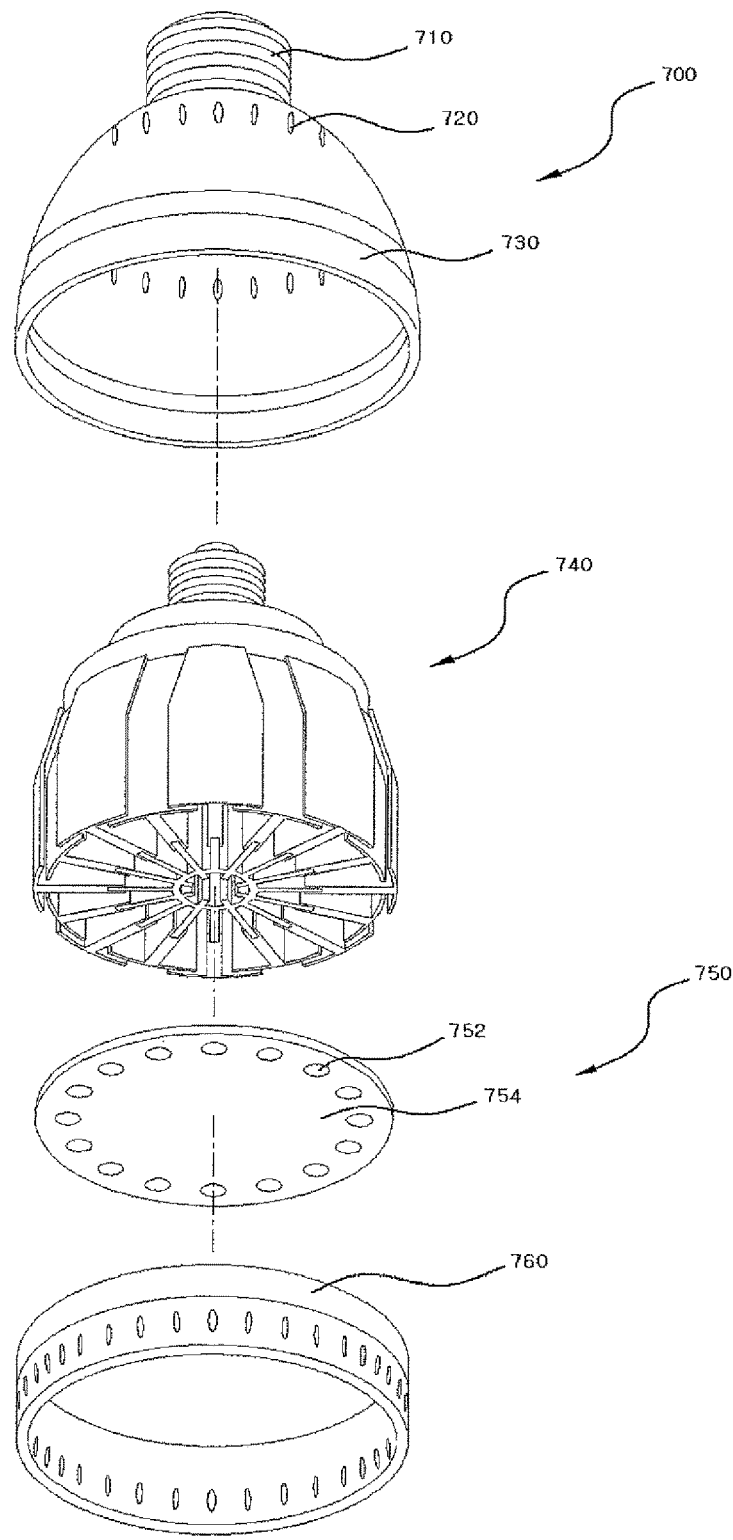
FIG. 18 is an exploded perspective view of a lighting apparatus including a light emitting device package in accordance with an embodiment as broadly described herein.

FIG. 18 is an exploded perspective view of a lighting apparatus including a light emitting device package as embodied and broadly described herein. The lighting apparatus may include a light source 750 to emit light, a housing 700 in which the light source 750 is installed, a heat dissipation device 740 to dissipate heat of the light source 750, and a holder 760 to connect the light source 750 and the heat dissipation device 740 to the housing 700.

The housing 700 may include a socket connector 710 for connection to an electric socket, and a body 730 connected with the socket connector 710. An air flow hole 720 may be formed through the body 730.

Alternatively, a plurality of air flow holes 720 may be formed through the body 730. That is, one air flow hole 720 may be formed through the body 730, or a plurality of air flow holes arranged in a radial shape may be formed through the body 730. Other arrangements of the plural air flow holes 730 may also be appropriate.

The light source 750 may include a substrate 754 and a plurality of light emitting device packages 752 provided on the substrate 754. The substrate 754 may have a shape capable of being inserted into an opening of the housing 700 and may be made of a material having a relatively high thermal conductivity so as to transfer heat to the heat dissipation device 740.

The holder 760 may be provided under the light source 750. The holder 760 may include a frame and additional air flow holes. An optical member may also be provided under the light source 750 so as to diffuse, scatter or converge light emitted from the light emitting device packages 752 of the light source 750. The lighting apparatus in accordance with this embodiment may employ a light emitting device package in accordance with an embodiment as broadly described herein, thereby extending lifespan of the light emitting device package mounted on the lighting apparatus and preventing light interference.

Figure 19:
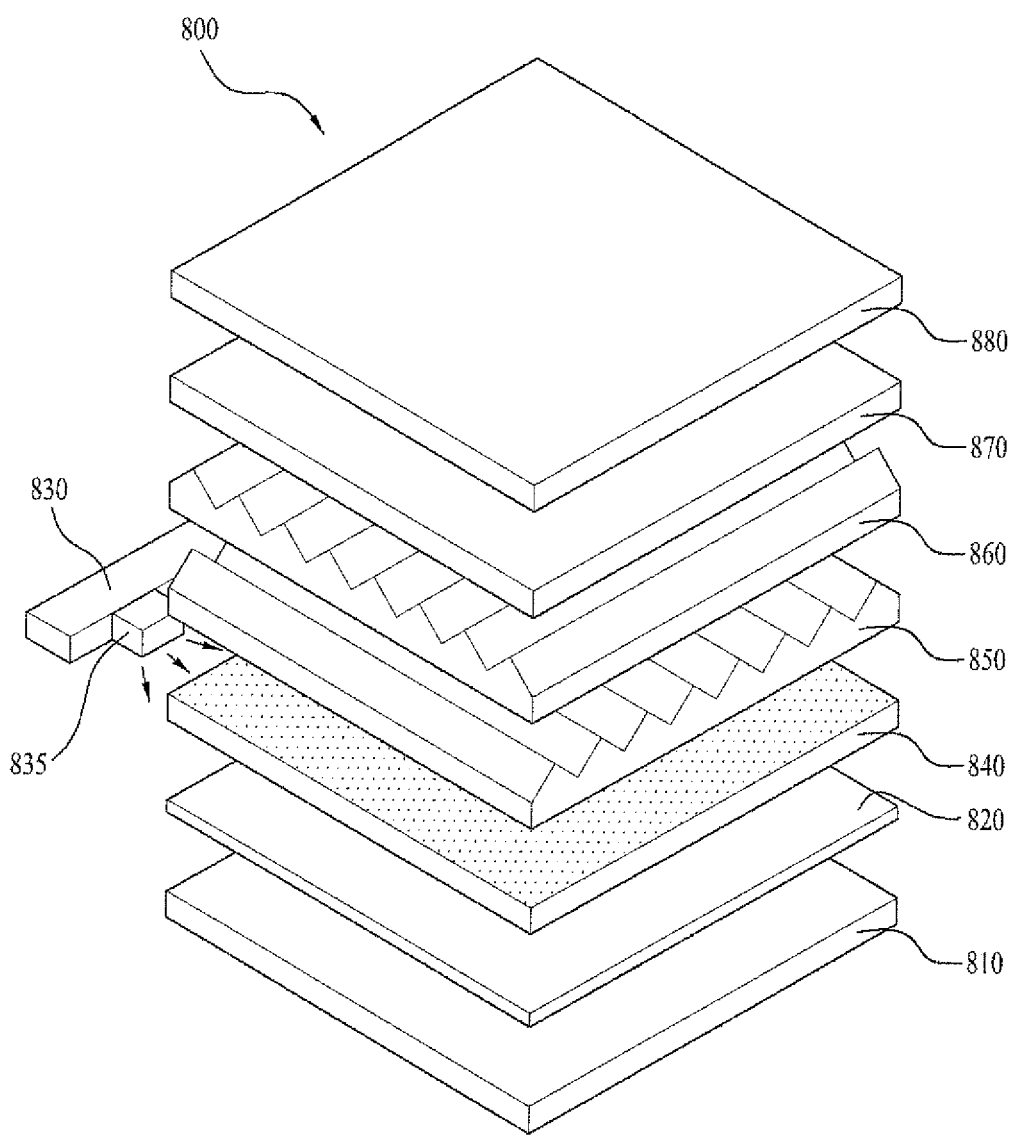
FIG. 19 is an exploded perspective view of a display apparatus including a light emitting device package in accordance with an embodiment as broadly described herein.

FIG. 19 is an exploded perspective view of a display apparatus including a light emitting device package as embodied and broadly described herein.

The display apparatus 800 may include a light source module, a reflective plate 820 provided over a bottom cover 810, a light guide plate 840 positioned in front of the reflective plate 820 to guide light emitted from the light source module to the front portion of the display apparatus 800, optical sheets including, for example, prism sheets 850 and 860 positioned in front of the light guide plate 840, a panel 870 positioned in front of the prism sheets 850 and 860, and a color filter 880 positioned in front of the panel 870. The bottom cover 810, the reflective plate 820, the light source module, the light guide plate 840 and the optical sheet may form a backlight unit.

The light source module may include a substrate 830 and light emitting device packages 835 provided on the substrate 830. A printed circuit board (PCB) may be used as the substrate 830 and the light emitting device package 100 shown in FIG. 1 may be used as the light emitting device package 835. Other combinations may also be appropriate.

The bottom cover 810 may receive components in the display apparatus 800. The reflective plate 820 may be provided as a separate element, as shown in FIG. 15, or may be provided by coating the rear surface of the light guide plate 840 or the front surface of the bottom cover 810 with a material having high reflectivity. The reflective plate 820 may be made of a material having relatively high reflectivity and being usable/able to be manufactured in an ultra thin state, such as, for example, polyethylene terephthalate (PET), or other such material.

The light guide plate 840 may scatter light emitted from the light source module so as to uniformly distribute the light throughout various/all regions of the display apparatus 800. Therefore, the light guide plate 840 may be made of a material having relatively high refractivity and transmittance, such as, for example, polymethylmethacrylate (PMMA), polycarbonate (PC), polyethylene (PE), or other such material.

A first prism sheet 850 may be formed by coating one surface of a base film with a polymer exhibiting light transmittance and elasticity, and the polymer may include a prism layer in which plural three-dimensional structures are repeated in a designated pattern. The pattern may be, for example, a stripe type in which ridges and valleys are repeated, as shown in FIG. 15, or other pattern as appropriate.

A second prism sheet 860 may be configured such that an arrangement direction of ridges and valleys formed on one surface of a base film of the second prism sheet 860 is vertical with respect to an arrangement direction of the ridges and valleys formed on one surface of the base film of the first prism sheet 850. Such a configuration may uniformly distribute light transmitted from the light module and the reflective sheet 820 toward the entire surface of the panel 870.

A protective sheet may be provided over each of the prism sheets 850 and 860. The protective sheet may include protective layers, including light-diffusing particles and a binder, on both surfaces of a base film. Further, the prism layer may be made of a polymer such as, for example, polyurethane, styrene-butadiene copolymer, polyacrylate, polymethacrylate, polymethyl methacrylate, polyethylene-terephthalate elastomer, polyisoprene, polysilicon and the like.

A diffusion sheet may be provided between the light guide plate 840 and the first prism sheet 850. The diffusion sheet may be made of a polyester or polycarbonate-based material and may maximally increase a light projection angle through refraction and scattering of light incident from the backlight unit. Further, the diffusion sheet may include a support layer including a light diffusing agent, and first layer formed on a light emitting surface (in the direction of the first prism sheet) and a second layer formed on a light incident surface (in the direction of the reflective sheet). The first and second layers may exclude a light diffusing agent.

In this embodiment, the optical sheets may include a combination of the diffusion sheet, the first prism sheet 850 and the second prism sheet 860. However, the optical sheets may include other combinations, such as, for example, a microlens array, a combination of a diffusion sheet and a microlens array, or a combination of a prism sheet and a microlens array.

A liquid crystal display panel may be used as the panel 870. However, other kinds of display devices requiring light sources may also be employed. The display panel 870 may be configured such that a liquid crystal layer is located between glass substrates and polarizing plates are mounted over both glass substrates so as to utilize polarizing properties of light. Such a liquid crystal layer may have properties between a liquid and a solid. That is, in the liquid crystal layer, liquid crystals which are organic molecules having fluidity like a liquid are regularly aligned, and the liquid crystal layer displays an image using changes in molecule alignment due to an external electric field.

Such a liquid crystal display panel used in the display apparatus may be an active matrix type, and may use transistors as switches to adjust voltage applied to each pixel. Further, a color filter 880 may be provided on the front surface of the panel 870, and may transmit only R, G and B light projected from the panel 870 per pixel, thereby displaying an image.

The display apparatus in accordance with this embodiment may employ a light emitting device package as embodied and broadly described herein, thereby preventing light interference between the light emitting devices 132 and 134.

A light emitting device package as embodied and broadly described herein may prevent discoloration of a main body so as to extend lifespan of the light emitting device package, and may prevent light interference.

A light emitting device package as embodied and broadly described herein may include a main body having a cavity including side surfaces and a bottom, a first reflective cup and a second reflective cup disposed in the bottom of the cavity of the main body and separated from each other, a first light emitting device disposed in the first reflective cup, and a second light emitting device disposed in the second reflective cup. The first reflective cup and the second reflective cup may be depressed from the bottom of the cavity of the main body. The first reflective cup and the second reflective cup may be made of one selected from the group including of silver, gold and copper.

The first reflective cup and the second reflective cup may prevent heat generated by the first light emitting device and the second light emitting device from being radiated to the main body.

At least a portion of each of the first reflective cup and the second reflective cup may pass through the main body and be exposed to the outside of the main body. The first reflective cup and the second reflective cup may be symmetrical in terms of shape and size. A tilt angle of the side surfaces of each of the first reflective cup and the second reflective cup with respect to the bottom thereof may be 90~160°.

The light emitting device package may also include an edge part located between an upper surface of the main body and the bottom of the cavity of the main body, having a height difference with the upper surface of the main body and being parallel with the upper surface of the main body. The upper surface of the first reflective cup may be parallel with the upper surface of the first light emitting device and the upper surface of the second reflective cup may be parallel with the upper surface of the second light emitting device.

In another embodiment as broadly described herein, a light emitting device package may include a main body having a cavity including side surfaces and a bottom, a first reflective cup and a second reflective cup disposed in the bottom of the cavity of the main body and separated from each other, a first light emitting device disposed within the first reflective cup, a second light emitting device disposed within the second reflective cup, and a connection part formed in the bottom of the cavity of the main body and separated from the first reflective cup and the second reflective cup, wherein the first light emitting device and the second light emitting device are electrically connected by the connection part. The first reflective cup and the second reflective cup may be depressed from the bottom of the cavity of the main body.

The light emitting device package may also include a first wire connecting the first reflective cup and the first light emitting device, a second wire connecting the first light emitting device and the connection part, a third wire connecting the connection part and the second light emitting device, and a fourth wire connecting the second light emitting device and the second reflective cup, wherein the first light emitting device and the second light emitting device are connected in series by the first wire, the second wire, the third wire, and the fourth wire.

The light emitting device package may also include a first wire connecting the first reflective cup and the first light emitting device, a second wire connecting the first light emitting device and the second reflective cup, a third wire connecting the first reflective cup and the second light emitting device, and a fourth wire connecting the second light emitting device and the second reflective cup, wherein the first light emitting device and the second light emitting device are connected in parallel by the first wire, the second wire, the third wire, and the fourth wire.

The light emitting device package may also include a first wire connecting the first reflective cup and the first light emitting device, a second wire connecting the first light emitting device and the second light emitting device, and a third wire connecting the second light emitting device and the second reflective cup, wherein the first light emitting device and the second light emitting device are connected in series by the first wire, the second wire, and the third wire.

At least a portion of each of the first reflective cup, the second reflective cup and the connection part may pass through the main body and be exposed to the outside of the main body.

A light emitting device package as embodied and broadly described herein may include a main body having a cavity formed therein, the cavity including side surfaces and a bottom, and a first reflective cup and a second reflective cup provided in the bottom of the cavity and separated from each other by a portion of the bottom of the cavity, and a first light emitting device provided in the first reflective cup, and a second light emitting device provided in the second reflective cup.

The first reflective cup and the second reflective cup may form recesses in the bottom of the cavity. A portion of each of the first reflective cup and the second reflective cup may pass through the main body and be exposed outside of the main body. The first reflective cup and the second reflective cup may be substantially symmetrical in shape and size. A tilt angle of respective side surfaces of each of the first reflective cup and the second reflective cup with respect to the respective bottom surface thereof may be between 90° and 160°.

The light emitting device package may also include a stepped edge formed between an upper surface of the main body and an upper end of the cavity formed therein, the stepped edge having a prescribed height difference with the upper surface of the main body and being parallel to the upper surface of the main body. An upper surface of the first reflective cup may be parallel to an upper surface of the first light emitting device and an upper surface of the second reflective cup may be parallel to an upper surface of the second light emitting device. A height of the first reflective cup may be greater than a height of the first light emitting device and a height of the second reflective cup may be greater than a height of the second light emitting device. A depth of the first reflective cup may be greater than a height of the first light emitting device and may be less than twice the height of the first light emitting device and a depth of the second reflective cup may be greater than a height of the second light emitting device and may be less than twice the height of the second light emitting device. A height of the first reflective cup may be less than a height of the first light emitting device and a height of the second reflective cup may be less than a height of the second light emitting device. A depth of the first reflective cup may be less than a height of the first light emitting device and may be greater than half the height of the first light emitting device and a depth of the second reflective cup may be less than a height of the second light emitting device and may be greater than half the height of the second light emitting device.

The light emitting device package may also include an encapsulation material filling an inside of the cavity of the main body, an inside of the first reflective cup in which the first light emitting device is provided and an inside of the second reflective cup in which the second light emitting device is provided so as to isolate the first light emitting device and the second light emitting device from the outside.

A light emitting device package as embodied and broadly described herein may include a main body having a cavity formed therein, and a first reflective cup and a second reflective cup provided in a bottom of the cavity, and a first light emitting device provided in the first reflective cup, and a second light emitting device provided in the second reflective cup, and a connection pad provided in the bottom of the cavity and separated from the first reflective cup and the second reflective cup.

The first and second reflective cups may be separated from each other by a portion of the bottom of the cavity, and wherein the first light emitting device and the second light emitting device may be electrically connected via the connection pad.

The light emitting device package may also include a first wire connecting the first reflective cup and the first light emitting device, and a second wire connecting the first light emitting device and the connection pad, and a third wire connecting the connection pad and the second light emitting device, and a fourth wire connecting the second light emitting device and the second reflective cup, wherein the first light emitting device and the second light emitting device are connected in series by the first wire, the second wire, the third wire, and the fourth wire.

The light emitting device package may also include a first wire connecting the first reflective cup and the first light emitting device, and a second wire connecting the first light emitting device and the second reflective cup, and a third wire connecting the first reflective cup and the second light emitting device, and a fourth wire connecting the second light emitting device and the second reflective cup, wherein the first light emitting device and the second light emitting device are connected in parallel by the first wire, the second wire, the third wire, and the fourth wire.

The light emitting device package may also include a first wire connecting the first reflective cup and the first light emitting device, and a second wire connecting the first light emitting device and the second light emitting device, and a third wire connecting the second light emitting device and the second reflective cup, wherein the first light emitting device and the second light emitting device are connected in series by the first wire, the second wire, and the third wire.

A light emitting device package as embodied and broadly described herein may include first and second reflective cups positioned adjacent to each other, wherein a contour of the first and second reflective cups form first and second cavities, respectively, and first and second light emitting devices respectively provided in the first and second cavities formed in the first and second reflective cups, and a side wall surrounding outer peripheral portions of the first and second reflective cups, and a dividing wall provided between the first and second reflective cups, wherein a height of the dividing wall is less than a height of the side wall.

The side walls may extend upward from top surfaces of the first and second reflective cups to define a third cavity. The first and second reflective cups may form recesses in a bottom of the third cavity. A first portion of the first reflective cup and a first portion of the second reflective cup may be exposed to an outside of the light emitting device package through respective openings in the bottom of the third cavity. A second portion of the first reflective cup and a second portion of the second reflective cup may extend through respective portions of the side walls to an outside of the light emitting device package.

The light emitting device package may also include a connection pad provided on the bottom of the third cavity, separated from the first reflective cup and the second reflective cup, wherein the first light emitting device and the second light emitting device are electrically connected via the connection pad. The light emitting device package may also include a plurality of wires each having a first end connected to one of the first or second light emitting device and a second end connected to one of the first or second reflective cup, respectively, or the connection pad.

A top surface of the first light emitting device may be positioned below a top edge of the first reflective cup and a top surface of the second light emitting device may be positioned below a top edge of the second reflective cup. A top surface of the first light emitting device may extend beyond a top edge of the first reflective cup and a top surface of the second light emitting device may extend beyond a top edge of the second reflective cup. A top surface of the first light emitting device may be substantially parallel to a top surface of the first reflective cup and a top surface of the second light emitting device may be substantially parallel to a top surface of the second reflective cup.

A depth of the first reflective cup may be greater than a height of the first light emitting device and may be less than twice the height of the first light emitting device, and a depth of the second reflective cup may be greater than a height of the second light emitting device and may be less than twice the height of the second light emitting device.

A depth of the first reflective cup may be less than a height of the first light emitting device and may be greater than half the height of the first light emitting device, and a depth of the second reflective cup may be less than a height of the second light emitting device and may be greater than half the height of the second light emitting device.

A light emitting device package as embodied and broadly described herein may include a main body, and a first reflective cup and a second reflective cup provided in the main body, and separated from each other by a portion of the main body, and a first light emitting device provided in the first reflective cup, and a second light emitting device provided in the second reflective cup, wherein the first reflective cup and the second reflective cup are made of a different material from the main body.

The light emitting device package may also include a connection pad provided in the main body, and separated from the first reflective cup and the second reflective cup, wherein the connection pad is made of a different material from the main body. The first light emitting device and the second light emitting device may be electrically connected via the connection pad. The main body may be made of a material such as polyphthalamide (PPA), or silicon (Si), photo-sensitive glass (PSG), or sapphire (Al2O3).

A light emitting device package as embodied and broadly described herein may include a main body, and a first reflective cup and a second reflective cup provided in the main body, and a first light emitting device provided in the first reflective cup, wherein the first light emitting device includes a first electrode and a second electrode, and a second light emitting device provided in the second reflective cup, wherein the second light emitting device includes a third electrode and a fourth electrode, wherein the first electrode is electrically connected to the first reflective cup and the fourth electrode is connected to the second reflective cup, and the first electrode and the fourth electrode have different polarity each other.

The second electrode may be electrically connected to the second reflective cup and the third electrode may be electrically connected to the first reflective cup. The second electrode may be electrically connected to the third electrode.

The light emitting device package may also include a connection pad provided in the main body and separated from the first reflective cup and the second reflective cup, wherein the connection pad electrically connects the second electrode with the third electrode. The first electrode and the third electrode may have the same polarity.

A light emitting device package as embodied and broadly described herein may include a bottom body, and a first reflective cup provided in the bottom body, and a second reflective cup provided in the bottom and separated from the first reflective cup by a portion of the bottom body, and a first light emitting device provided in the first reflective cup, and a second light emitting device provided in the second reflective cup, and side surfaces on the bottom body surrounding the first reflective cup and the second reflective cup. The light emitting device package may also include a connection pad in the bottom body and separated from the first reflective cup and the second reflective cup by another portion of the bottom body.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a main body including a bottom portion, first and second walls on the bottom portion extending in a first direction, and third and fourth walls on the bottom portion extending in a second direction perpendicular to the first direction;
a first reflective metal provided in the bottom portion of the main body;
a second reflective metal provided in the bottom portion of the main body and separated from the first reflective metal;
a first light emitting device disposed on an upper surface of the first reflective metal;
a second light emitting device disposed on an upper surface of the second reflective metal;
a wire connected between the first light emitting device and the second light emitting device; and
a zener diode disposed on the first reflective metal or the second reflective metal, wherein the first reflective metal is exposed at an outer surface of the first wall of the main body, and the second reflective metal is exposed at an outer surface of the second wall of the main body, wherein a lower surface of the first reflective metal and a lower surface of the second reflective metal are exposed at the lower surface of the main body, wherein the exposed lower surface of the first reflective metal and the exposed lower surface of the second reflective metal are flush with the lower surface of the main body, wherein the bottom portion includes a first portion and a second portion disposed between the first reflective metal and the second reflective metal, wherein the first portion is located on the second portion, wherein a length in the second direction of the second portion is different from a length in the second direction of the first portion, wherein the first light emitting device and the second light emitting device are connected in series by the wire, and wherein the zener diode is disposed adjacent to one of the first, second, third, or fourth walls.

2. The light emitting device package of claim 1, wherein the length in the second direction of the second portion is greater than the length in the second direction of the first portion.

3. The light emitting device package of claim 1, wherein the length in the second direction of the second portion decreases with increasing a distance from a lower surface of the second portion.

4. The light emitting device package of claim 3, wherein an upper surface of the first portion is flush with the upper surface of the first reflective metal and the upper surface of the second reflective metal.

5. The light emitting device package of claim 4, wherein the upper surface of the first portion includes a first region having a constant length in the second direction.

6. The light emitting device package of claim 5, wherein the wire is located over the first region.

7. The light emitting device package of claim 1, wherein the first light emitting device comprises a first substrate, a first light emitting structure on the first substrate including a first-first conductive type semiconductor, an first active layer, and a first-second conductive type semiconductor, a first electrode on the first-first conductive type semiconductor, and a second electrode on the first- first conductive type semiconductor, wherein the second light emitting device comprises a second substrate, a second light emitting structure on the second substrate including a second-first conductive type semiconductor, an second active layer, and a second-second conductive type semiconductor, a third electrode on the second-first conductive type semiconductor, and a fourth electrode on the second-first conductive type semiconductor.

8. The light emitting device package of claim 7, wherein the wire connects the second electrode of the first light emitting device and the third electrode of the second light emitting device; and wherein the first electrode and the third electrode are n type electrode, and the second electrode and the fourth electrode are p type electrode.

9. A light emitting device package, comprising:
   a main body including a bottom portion, first and second walls on the bottom portion extending in a first direction, and third and fourth walls on the bottom portion extending in a second direction perpendicular to the first direction;
   a first reflective metal provided in the bottom portion of the main body;
   a second reflective metal provided in the bottom portion of the main body and separated from the first reflective metal;
   a first light emitting device disposed on an upper surface of the first reflective metal; and
   a second light emitting device disposed on an upper surface of the second reflective metal; and
   a zener diode disposed on the main body, wherein the first reflective metal is exposed at an outer surface of the first wall of the main body, and the second reflective metal is exposed at an outer surface of the second wall of the main body, and the first wall of the main body is opposite to the second wall of the main body, wherein each of the exposed outer surface of the first reflective metal and the exposed outer surface of the second reflective metal has two protrusions extending in the second direction and spaced away from each other, wherein a lower surface of the first reflective metal and a lower surface of the second reflective metal are exposed at a lower surface of the main body, wherein the exposed lower surface of the first reflective metal and the exposed lower surface of the second reflective metal are flush with the lower surface of the main body, wherein a portion of the main body is disposed between a first portion of the first reflective metal and a second portion of the second reflective metal, and wherein an upper surface of the first portion of the first reflective metal includes a first straight portion extending in the first direction and a first sloped portion sloped with respect to the first straight portion.

10. The light emitting device package of claim 9, wherein the zener diode is disposed adjacent to one of the first, second, third, or fourth walls.

11. The light emitting device package of claim 9, wherein an upper surface of the second portion of the second reflective metal includes a second straight portion extending in the first direction and a second sloped portion sloped with respect to the second straight portion.

12. The light emitting device package of claim 9, wherein the zener diode is disposed on the upper surface of the second reflective metal.

13. The light emitting device package of claim 12, wherein the zener diode is electrically connected to the first reflective metal.

14. The light emitting device package of claim 13, further comprising:
   a first wire connecting the zener diode with the upper surface of the first reflective metal.

15. The light emitting device package of claim 14, wherein the first light emitting device comprises a first substrate, a first light emitting structure on the first substrate including a first-first conductive type semiconductor, an first active layer, and a first-second conductive type semiconductor, a first electrode on the first-first conductive type semiconductor, and a second electrode on the first- second conductive type semiconductor, wherein the second light emitting device comprises a second substrate, a second light emitting structure on the second substrate including a second-first conductive type semiconductor, an second active layer, and a second-second conductive type semiconductor, a third electrode on the second-first conductive type semiconductor, and a fourth electrode on the second-second conductive type semiconductor.

16. The light emitting device package of claim 15, wherein the first electrode of the first emitting device is electrically connected to the first reflective metal by a second wire, the fourth electrode of the second emitting device is electrically connected to the second reflective metal by a third wire, the second electrode of the first emitting device is electrically connected to the second reflective metal by a fourth wire, and the third electrode of the second electrode is electrically connected to the first reflective metal by a fifth wire.

17. The light emitting device package of claim 9, wherein a first tilt angle of an inner surface of the third wall of the main body between the third wall of the main body and the first light emitting device or between the third wall of the main body and the second light emitting device is different to a second tilt angle of the inner surface of the third wall at a center line of the third wall of the main body in the second direction.

18. The light emitting device package of claim 9, a first distance passing by the first light emitting device or the second light emitting device between the third wall and the fourth wall in the first direction is different to a second distance between the third wall and the fourth wall in the first direction at a center line of the main body in the second direction.

19. The light emitting device package of claim 9, wherein the main body has a resin injection hole formed on the lower surface of the main body.

20. A light emitting device package, comprising:
   a main body including a bottom portion, first and second walls on the bottom portion extending in a first direction, and third and fourth walls on the bottom portion extending in a second direction perpendicular to the first direction;
   a first reflective metal provided on the main body;
   a second reflective metal provided on the main body and separated from the first reflective metal;
   a first light emitting device disposed on the first reflective metal; and
   a second light emitting device disposed on the second reflective metal; and
   a zener diode disposed on the first reflective metal or the second reflective metal adjacent to one of the first, second, third, or fourth walls, wherein the first reflective metal is exposed at an outer surface of the first wall of the main body, and the second reflective metal is exposed at an outer surface of the second wall of the main body, and the first wall of the main body is opposite to the second wall of the main body, wherein each of the exposed outer surface of the first reflective metal and the exposed outer surface of the second reflective metal has two protrusions extending in the second direction and spaced away from each other, wherein a lower surface of the first reflective metal and a lower surface of the second reflective metal are exposed at a lower surface of the main body, wherein the exposed lower surface of the first reflective metal and the exposed lower surface of the second reflective metal are flush with the lower surface of the main body, wherein a portion of the main body is disposed between a first portion of the first reflective metal and a second portion of the second reflective metal, and wherein an upper surface of the first portion of the first reflective metal includes a first straight portion extending in the first direction and a first sloped portion sloped with respect to the first straight portion.

* * * * *